(12) United States Patent
Zhao et al.

(10) Patent No.: US 12,094,714 B2
(45) Date of Patent: Sep. 17, 2024

(54) SEMICONDUCTOR DEVICES WITH DOPED SEMICONDUCTOR MATERIALS

(71) Applicant: INNOSCIENCE (ZHUHAI) TECHNOLOGY CO., LTD., Zhuhai (CN)

(72) Inventors: Qiyue Zhao, Zhuhai (CN); Chuan He, Zhuhai (CN)

(73) Assignee: INNOSCIENCE (ZHUHAI) TECHNOLOGY CO., LTD., Zhuhai (CN)

( * ) Notice: Subject to any disclaimer, the term of this patent is extended or adjusted under 35 U.S.C. 154(b) by 0 days.

(21) Appl. No.: 17/711,064

(22) Filed: Apr. 1, 2022

(65) Prior Publication Data

US 2022/0223418 A1 Jul. 14, 2022

Related U.S. Application Data

(63) Continuation of application No. 16/850,022, filed on Apr. 16, 2020, now Pat. No. 11,322,355.

(30) Foreign Application Priority Data

Feb. 25, 2020 (CN) .......................... 202010117937.2

(51) Int. Cl.
*H01L 29/66* (2006.01)
*H01L 21/04* (2006.01)
*H01L 21/265* (2006.01)

(52) U.S. Cl.
CPC ...... *H01L 21/0415* (2013.01); *H01L 21/2654* (2013.01); *H01L 29/66462* (2013.01)

(58) Field of Classification Search
CPC ............. H01L 21/0415; H01L 21/2654; H01L 29/66462; H01L 21/8258; H01L 27/0629;
(Continued)

(56) References Cited

U.S. PATENT DOCUMENTS 4,315,781 A * 2/1982 Henderson .......... H01L 21/2652
257/E21.336
5,612,232 A * 3/1997 Thero ................. H01L 29/6606
438/572

(Continued)

FOREIGN PATENT DOCUMENTS

CN 102237360 A 11/2011
CN 107644915 A 1/2018
JP 2008270681 * 11/2008

OTHER PUBLICATIONS

State Intellectual Property Office of the People's Republic of China, Office Action and Search Report Issued in Application No. 202010117937.2, Feb. 28, 2023, 14 pages. (Submitted with Machine Translation).

(Continued)

*Primary Examiner* — Duy T Nguyen
(74) *Attorney, Agent, or Firm* — McCoy Russell LLP

(57) ABSTRACT

A semiconductor device includes a doped substrate, a barrier layer, a channel layer, a doped semiconductor structure, and the conductive structure. The barrier layer is disposed on the doped substrate. The channel layer is disposed between the doped substrate and the barrier layer, in which a bandgap of the barrier layer is greater than a bandgap of the channel layer. The doped semiconductor structure is embedded in the doped substrate, in which the doped substrate and the doped semiconductor structure have different polarities, so as to form a diode therebetween. The conductive structure is disposed over the doped substrate and makes contact with the doped semiconductor structure, in which the conductive structure extends from the doped semiconductor structure to a position higher than the channel layer and the barrier layer.

14 Claims, 11 Drawing Sheets

(58) Field of Classification Search
CPC ........... H01L 21/26586; H01L 29/1066; H01L 29/1075; H01L 29/2003; H01L 29/41766; H01L 29/8611; H01L 29/7786; H01L 29/778; H01L 29/0603; H01L 29/0684; H01L 29/7782
USPC ........................................................ 257/288
See application file for complete search history.

(56) References Cited

U.S. PATENT DOCUMENTS

| | | | |
|---|---|---|---|
| 2006/0060895 | A1 | 3/2006 | Hikita et al. |
| 2007/0298564 | A1* | 12/2007 | Brar .................... H01L 27/0629 257/E29.338 |
| 2008/0272408 | A1* | 11/2008 | Vora .................... H01L 29/1066 438/653 |
| 2009/0283776 | A1* | 11/2009 | Iwamuro ........... H01L 29/66068 438/584 |
| 2011/0260174 | A1* | 10/2011 | Hebert ................ H01L 29/7786 257/77 |
| 2016/0118490 | A1* | 4/2016 | Padmanabhan ..... H01L 27/0629 257/195 |
| 2016/0260615 | A1 | 9/2016 | Hirai et al. |
| 2017/0033185 | A1* | 2/2017 | Shimizu .............. H01L 29/7397 |
| 2017/0092986 | A1* | 3/2017 | Ogawa .................. H01M 4/366 |
| 2017/0345812 | A1* | 11/2017 | Chou .................. H01L 27/0694 |
| 2018/0026099 | A1 | 1/2018 | Miyamoto et al. |
| 2018/0182886 | A1* | 6/2018 | Kobayashi .......... H01L 29/0878 |

OTHER PUBLICATIONS

United States Patent and Trademark Office, Non-Final Office Action Issued in U.S. Appl. No. 17/711,062, filed Mar. 15, 2023, 38 pages.
United States Patent and Trademark Office, Final Office Action Issued in U.S. Appl. No. 17/711,062, filed Jul. 5, 2023, 15 pages.
United States Patent and Trademark Office, Advisory Action Issued in U.S. Appl. No. 17/711,062, filed Sep. 18, 2023, 5 pages.

* cited by examiner

US 12,094,714 B2

SEMICONDUCTOR DEVICES WITH DOPED SEMICONDUCTOR MATERIALS

CROSS REFERENCE TO RELATED APPLICATIONS

This application is a continuation application of U.S. Patent No. 11,322,355, which claims priority of CN Patent Application No. 202010117937.2, filed on 25 Feb. 2020, the disclosure of which is hereby incorporated by reference in its entirety.

BACKGROUND OF THE INVENTION

1. Field of the Invention

The disclosure is related to a semiconductor device, and in particular, to a semiconductor device including a high-electron-mobility transistor (HEMT) and a diode.

2. Description of the Related Art

A semiconductor component including a direct band gap, for example, a semiconductor component including a III-V material or III-V compounds, may operate or work under a variety of conditions or environments (for example, different voltages or frequencies) due to its characteristics.

The foregoing semiconductor component may include a HEMT, a heterojunction bipolar transistor (HBT), a heterojunction field effect transistor (HFET), or a modulation-doped field effect transistor (MODFET).

SUMMARY OF THE INVENTION

Some embodiments of the disclosure provide a semiconductor device. The semiconductor device includes a doped substrate, a barrier layer, a channel layer, a doped semiconductor structure, and the conductive structure. The barrier layer is disposed on the doped substrate. The channel layer is disposed between the doped substrate and the barrier layer, in which a bandgap of the barrier layer is greater than a bandgap of the channel layer. The doped semiconductor structure is embedded in the doped substrate, in which the doped substrate and the doped semiconductor structure have different polarities, so as to form a diode therebetween. The conductive structure is disposed over the doped substrate and makes contact with the doped semiconductor structure, in which the conductive structure extends from the doped semiconductor structure to a position higher than the channel layer and the barrier layer.

Some embodiments of this disclosure provide a semiconductor device. The semiconductor device includes a doped substrate, a barrier layer, a channel layer, and a doped semiconductor structure, a first conductive structure, a gate conductor, and a second conductive structure. The barrier layer is disposed on the doped substrate. The channel layer is disposed between the doped substrate and the barrier layer, in which a bandgap of the barrier layer is greater than a bandgap of the channel layer. The doped semiconductor structure is embedded in the doped substrate. The first conductive structure is disposed over the doped substrate and makes contact with the doped semiconductor structure. The gate conductor is disposed over the channel layer. The second conductive structure is disposed over the channel layer and between the first conductive structure and the gate conductor.

BRIEF DESCRIPTION OF THE DRAWINGS

Aspects of the disclosure will become more comprehensible from the following detailed description made with reference to the accompanying drawings. It should be noted that, various features may not be drawn to scale. In fact, the sizes of the various features may be increased or reduced arbitrarily for the purpose of clear description.

PREFERRED EMBODIMENT OF THE PRESENT INVENTION

Figure 1A:
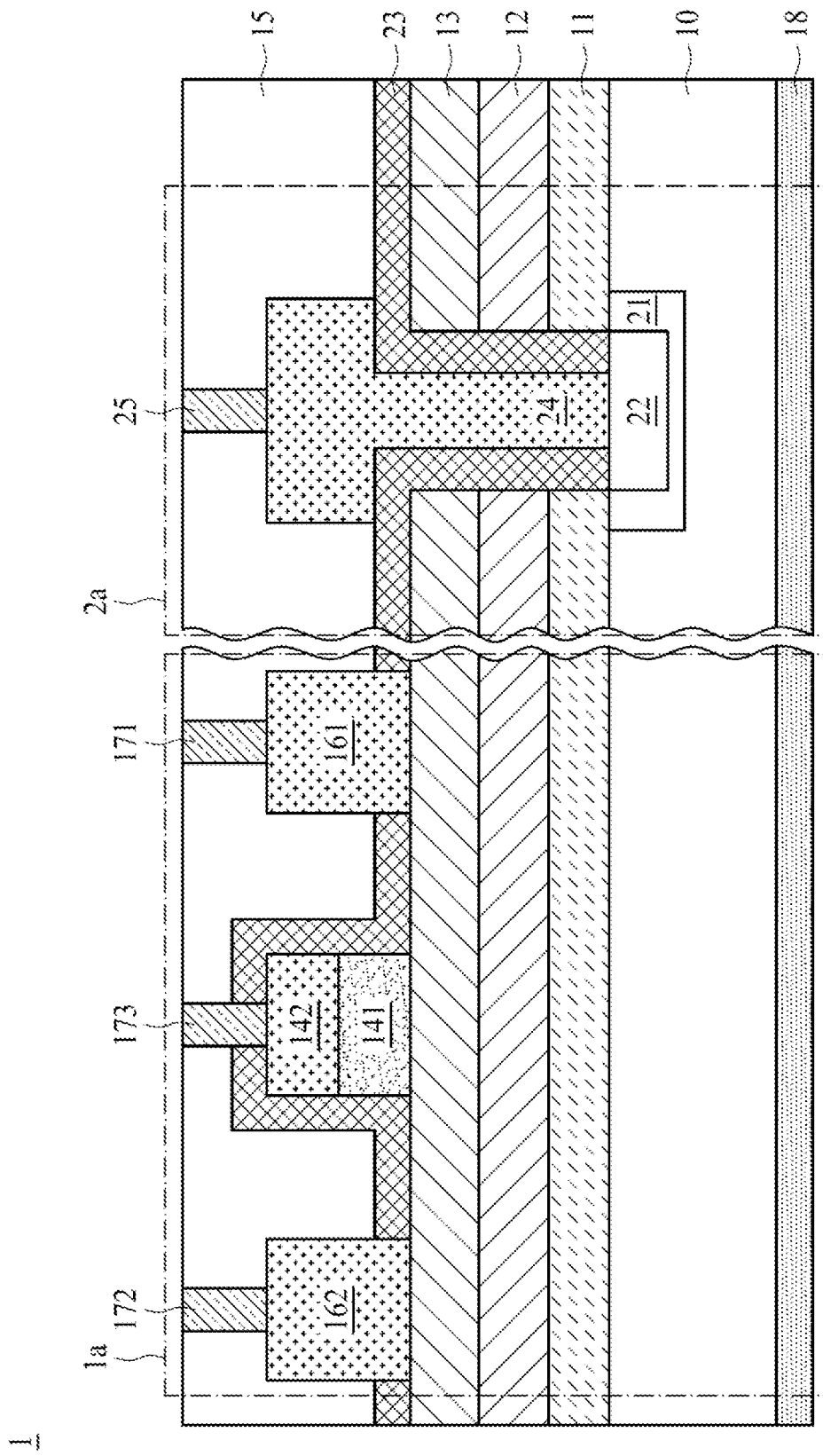
FIG. 1A is a side view of a semiconductor device according to some embodiments of the disclosure.

The following disclosure provides many different embodiments or examples for implementing different features of the provided subject matter. Specific examples of components and arrangements are described below. Certainly, these descriptions are merely examples and are not intended to be limiting. In the disclosure, in the following descriptions, the description of the first feature being formed on or above the second feature may include an embodiment in which the first feature and the second feature are formed to be in direct contact, and may further include an embodiment in which an additional feature may be formed between the first feature and the second feature to enable the first feature and the second feature to be not in direct contact. In addition, in the disclosure, reference numerals and/or letters may be repeated in examples. This repetition is for the purpose of simplification and clarity, and does not indicate a relationship between the described various embodiments and/or configurations.

The embodiments of the disclosure are described in detail below. However, it should be understood that many applicable concepts provided by the disclosure may be implemented in a plurality of specific environments. The described specific embodiments are only illustrative and do not limit the scope of the disclosure.

A direct band gap material, such as a III-V compound, may include but is not limited to, for example, gallium arsenide (GaAs), indium phosphide (InP), gallium nitride (GaN), Indium gallium arsenide (InGaAs), Indium aluminum arsenide (InAlAs), and the like.

FIG. 1A is a side view of a semiconductor device 1 according to some embodiments of the disclosure.

As shown in FIG. 1A, the semiconductor device 1 may include a component 1a and a component 2a.

The component 1a may include a substrate 10, a buffer layer 11, a semiconductor layer 12, a semiconductor layer 13, a doped semiconductor layer 141, a conductive structure 142, a passivation layer 15, a conductive structure 161, a conductive structure 162, a conductive structure 171, a conductive structure 172, a conductive structure 173, a conductive layer 18, and an insulation layer 23.

The substrate 10 may include, for example, but is not limited to, silicon (Si), doped silicon (doped Si) or another semiconductor material. In some embodiments, the substrate 10 may include a p-type semiconductor material. The substrate 10 may include a p-type semiconductor material having a doping concentration of about $10^{17}$ cm$^{-3}$ to about $10^{21}$ cm$^{-3}$. The substrate 10 may include a p-type semiconductor material having a doping concentration of about $10^{9}$ cm$^{-3}$ to about $10^{21}$ cm$^{-3}$. The substrate 10 may include a p-type semiconductor material having a doping concentration of about $10^{20}$ cm$^{-3}$ to about $10^{21}$ cm$^{-3}$. In some embodiments, the substrate 10 may include a p-type doped silicon layer. In some embodiments, the substrate 10 may include a silicon layer doped with arsenic (As). In some embodiments, the substrate 10 may include a silicon layer doped with phosphorus (P). In some embodiments, the substrate 10 may include an n-type semiconductor material. The substrate 10 may include an n-type semiconductor material having a doping concentration of about $10^{17}$ cm$^{-3}$ to about $10^{21}$ cm$^{-3}$. The substrate 10 may include an n-type semiconductor material having a doping concentration of about $10^{19}$ cm$^{-3}$ to about $10^{21}$ cm$^{-3}$. The substrate 10 may include an n-type semiconductor material having a doping concentration of about $10^{20}$ cm$^{-3}$ to about $10^{21}$ cm$^{-3}$. In some embodiments, the substrate 10 may include an n-type doped silicon layer. In some embodiments, the substrate 10 may include a silicon layer doped with boron (B). In some embodiments, the substrate 10 may include a silicon layer doped with gallium (Ga).

The buffer layer 11 may be disposed on the substrate 10. In some embodiments, the buffer layer 11 may include nitrides. In some embodiments, the buffer layer 11 may include, for example, but is not limited to, aluminum nitride (AlN). In some embodiments, the buffer layer 11 may include, for example, but is not limited to, aluminum gallium nitride (AlGaN). The buffer layer 11 may include a multi-layer structure. The buffer layer 11 may include a single layer structure.

The semiconductor layer 12 may be disposed on the buffer layer 11. The semiconductor layer 12 may include a III-V material. The semiconductor layer 12 may include, for example, but is not limited to, III nitride. The semiconductor layer 12 may include, for example, but is not limited to, GaN. The semiconductor layer 12 may include, for example, but is not limited to, AlN. The semiconductor layer 12 may include, for example, but is not limited to, InN. The semiconductor layer 12 may include, for example, but is not limited to, compound $In_xAl_yGa_{1-x-y}N$, where x+y≤1. The semiconductor layer 12 may include, for example, but is not limited to, compound $Al_yGa_{(1-y)}N$, where y≤1.

The semiconductor layer 13 may be disposed on the semiconductor layer 12. The semiconductor layer 13 may include a III-V material. The semiconductor layer 13 may include, for example, but is not limited to, III nitride. The semiconductor layer 13 may include, for example, but is not limited to, compound $Al_yGa_{(1-y)}N$, where y≤1. The semiconductor layer 13 may include, for example, but is not limited to, GaN. The semiconductor layer 13 may include, for example, but is not limited to, AlN. The semiconductor layer 13 may include, for example, but is not limited to, InN. The semiconductor layer 13 may include, for example, but is not limited to, compound $In_xAl_yGa_{1-x-y}N$, where x+y≤1.

A heterojunction may be formed between the semiconductor layer 13 and the semiconductor layer 12. The semiconductor layer 13 may have a larger band gap than the semiconductor layer 12. For example, the semiconductor layer 13 may include AlGaN that may have a band gap of about 4 eV, and the semiconductor layer 12 may include GaN that may have a band gap of about 3.4 eV.

In the component 1a, the semiconductor layer 12 may be used as a channel layer. In the component 1a, the semiconductor layer 12 may be used as a channel layer disposed on the buffer layer 11. In the component 1a, because the band gap of the semiconductor layer 12 is less than the band gap of the semiconductor layer 13, two dimensional electron gas (2DEG) may be formed in the semiconductor layer 12. In the component 1a, because the band gap of the semiconductor layer 12 is less than the band gap of the semiconductor layer 13, 2DEG may be formed in the semiconductor layer 12 and the 2DEG is close to interfaces of the semiconductor layer 13 and the semiconductor layer 12.

In the component 1a, the semiconductor layer 13 may be used as a barrier layer. In the component 1a, the semiconductor layer 13 may be used as a barrier layer disposed on the semiconductor layer 12.

The doped semiconductor layer 141 may be disposed on the semiconductor layer 13. The doped semiconductor layer 141 may include a doped III-V material. The doped semiconductor layer 141 may include a p-type III-V material. The doped semiconductor layer 141 may include, for example, but is not limited to, p-type III nitride. The doped semiconductor layer 141 may include, for example, but is not limited to, p-type GaN. The doped semiconductor layer 141 may include, for example, but is not limited to, p-type AlN. The doped semiconductor layer 141 may include, for example, but is not limited to, p-type InN. The doped semiconductor layer 141 may include, for example, but is not limited to, p-type AlGaN. The doped semiconductor layer 141 may include, for example, but is not limited to, p-type InGaN. The doped semiconductor layer 141 may include, for example, but is not limited to, p-type InAlN. If the doped semiconductor layer 141 includes a p-type III-V material, a doped material of the doped semiconductor layer 141 may include, for example, but is not limited to, at least one of Mg, Zn, and Ca.

The doped semiconductor layer 141 may also include another p-type semiconductor material. The doped semiconductor layer 141 may include, for example, but is not limited to, p-type CuO. The doped semiconductor layer 141 may include, for example, but is not limited to, p-type NiO$_x$. If the doped semiconductor layer 141 includes p-type CuO, a doped material of the doped semiconductor layer 141 may include, for example, but is not limited to, at least one of Mg, Zn, and Ca. If the doped semiconductor layer 141 includes p-type NiO$_x$, a doped material of the doped semiconductor layer 141 may include, for example, but is not limited to, at least one of Mg, Zn, and Ca.

The doped semiconductor layer 141 may include a p-type semiconductor material having a doping concentration of about $10^{17}$ cm$^{-3}$ to about $10^{21}$ cm$^{-3}$. The doped semiconductor layer 141 may include a p-type semiconductor material having a doping concentration of about $10^{19}$ cm$^{-3}$ to about $10^{21}$ cm$^{-3}$. The doped semiconductor layer 141 may include a p-type semiconductor material having a doping concentration of about $10^{20}$ cm$^{-1}$ to about $10^{21}$ cm$^{-3}$.

The conductive structure 142 may be disposed on the semiconductor layer 13. The conductive structure 142 may be disposed on the doped semiconductor layer 141, so that the doped semiconductor layer 141 is located between the semiconductor layer 13 and the conductive structure 142.

The conductive structure 142 may include a metal. The conductive structure 142 may include, for example, but is not limited to, gold (Au), platinum (Pt), titanium (Ti), palladium (Pd), nickel (Ni), and wolfram (W). The conductive structure 142 may include a metal compound. The conductive structure 142 may include, for example, but is not limited to, titanium nitride (TiN).

In the component 1a, the conductive structure 142 may be used as a gate conductor. In the component 1a, the conductive structure 142 may be configured to control the 2DEG in the semiconductor layer 12. In the component 1a, a voltage may be applied to the conductive structure 142 to control the 2DEG in the semiconductor layer 12. In the component 1a, a voltage may be applied to the conductive structure 142 to control the 2DEG in the semiconductor layer 12 and below the conductive structure 142. In the component 1a, a voltage may be applied to the conductive structure 142 to control the connection or disconnection between the conductive structure 161 and the conductive structure 162.

The conductive structure 161 may be disposed on the semiconductor layer 13. The conductive structure 161 may include a metal. The conductive structure 161 may include, for example, but is not limited to, aluminum (Al), titanium (Ti), palladium (Pd), nickel (Ni), and wolfram (W). The conductive structure 161 may include a metal compound. The conductive structure 161 may include, for example, but is not limited to, titanium nitride (TiN).

The conductive structure 162 may be disposed on the semiconductor layer 13. The conductive structure 162 may include a metal. The conductive structure 162 may include, for example, but is not limited to, aluminum (Al), titanium (Ti), palladium (Pd), nickel (Ni), and wolfram (W). The conductive structure 162 may include a metal compound. The conductive structure 162 may include, for example, but is not limited to, titanium nitride (TiN).

In the component 1a, the conductive structure 161 may be used as, for example, but is not limited to, a drain conductor. In the component 1a, the conductive structure 161 may be used as, for example, but is not limited to, a source conductor.

In the component 1a, the conductive structure 162 may be used as, for example, but is not limited to, a source conductor. In the component 1a, the conductive structure 162 may be used as, for example, but is not limited to, a drain conductor.

In some embodiments, the conductive structure 161 may be used as a drain conductor of the component 1a, the conductive structure 162 may be used as a source conductor of the component 1a, and the conductive structure 142 may be used as a gate conductor of the component 1a. Although the conductive structure 161 that may be used as a drain conductor and the conductive structure 162 that may be used as a source conductor are respectively disposed on both sides of the conductive structure 142 that may be used as a gate conductor in FIG. 1A, the conductive structure 161, the conductive structure 162, and the conductive structure 142 may be disposed differently in other embodiments of the disclosure according to design requirements.

The conductive structure 171 may be located on the semiconductor layer 13. The conductive structure 171 may be disposed on the conductive structure 161. The conductive structure 171 may be used as a through hole. The conductive structure 171 may be used as a through hole for electrically connecting the conductive structure 161 to the outside. The conductive structure 171 may include a metal. The conductive structure 171 may include a metal compound. The conductive structure 171 may include, for example, but is not limited to, copper (Cu), wolfram carbide (WC), titanium (Ti), titanium nitride (TiN) or aluminum copper (Al—Cu).

The conductive structure 172 may be located on the semiconductor layer 13. The conductive structure 172 may be disposed on the conductive structure 162. The conductive structure 172 may be used as a through hole. The conductive structure 172 may be used as a through hole for electrically connecting the conductive structure 162 to the outside. The conductive structure 172 may include a metal. The conductive structure 172 may include a metal compound. The conductive structure 172 may include, for example, but is not limited to, copper (Cu), wolfram carbide (WC), titanium (Ti), titanium nitride (TiN) or aluminum copper (Al—Cu).

The conductive structure 173 may be located on the semiconductor layer 13. The conductive structure 173 may be disposed on the conductive structure 142. The conductive structure 173 may be used as a through hole. The conductive structure 173 may be used as a through hole for electrically connecting the conductive structure 142 to the outside. The conductive structure 173 may include a metal. The conductive structure 173 may include a metal compound. The conductive structure 173 may include, for example, but is not limited to, copper (Cu), wolfram carbide (WC), titanium (Ti), titanium nitride (TiN) or aluminum copper (Al—Cu).

The insulation layer 23 may be disposed on the semiconductor layer 13. The insulation layer 23 may surround the conductive structure 161. The insulation layer 23 may surround the conductive structure 162. The insulation layer 23 may surround the doped semiconductor layer 141. The insulation layer 23 may surround the conductive structure 142. The insulation layer 23 may include a dielectric material. The insulation layer 23 may include nitride. The insulation layer 23 may include, for example, but is not limited to, silicon nitride ($Si_3N_4$). The insulation layer 23 may include oxide. The insulation layer 23 may include, for example, but is not limited to, silicon oxide ($SiO_2$). The insulating layer 23 may electrically isolate the conductive structure 161 from the conductive structure 162. The insulation layer 23 may electrically isolate the conductive structure 161 from the conductive structure 142. The insulation layer 23 may electrically isolate the conductive structure 162 from the conductive structure 142.

The passivation layer 15 may be disposed on the semiconductor layer 13. The passivation layer 15 may be disposed on the insulation layer 23. The passivation layer 15 may be used as an interlayer dielectric layer. The passivation layer 15 may surround the conductive structure 161. The passivation layer 15 may surround the conductive structure 162. The passivation layer 15 may surround the doped semiconductor layer 141. The passivation layer 15 may surround the conductive structure 171. The passivation layer 15 may surround the conductive structure 172. The passivation layer 15 may surround the conductive structure 173. The passivation layer 15 may surround the conductive structure 142. The passivation layer 15 may include a dielectric material. The passivation layer 15 may include nitride. The passivation layer 15 may include, for example, but is not limited to, silicon nitride ($Si_3N_4$). The passivation layer 15 may include oxide. The passivation layer 15 may include, for example, but is not limited to, silicon oxide ($SiO_2$). The passivation layer 15 may electrically isolate the conductive structure 161 from the conductive structure 162. The passivation layer 15 may electrically isolate the conductive structure 161 from the conductive structure 142. The passivation layer 15 may electrically isolate the conductive structure 162 from the conductive structure 142. The passivation layer 15 may electrically isolate the conductive structure 171 from the conductive structure 172. The passivation layer 15 may electrically isolate the conductive structure 171 from the conductive structure 173. The passivation layer 15 may electrically isolate the conductive structure 172 from the conductive structure 173.

The conductive layer 18 may be disposed below the substrate 10. The conductive layer 18 may be disposed below the substrate 10 so as to be opposite to the semiconductor layer 12. The conductive layer 18 may be disposed below the substrate 10 so as to be opposite to the semiconductor layer 13. The conductive layer 18 may be disposed below the substrate 10 so as to be opposite to the doped semiconductor layer 141. The conductive layer 18 may be disposed below the substrate 10 so as to be opposite to the conductive structure 142. The conductive layer 18 may be disposed below the substrate 10 so as to be opposite to the conductive structure 161. The conductive layer 18 may be disposed below the substrate 10 so as to be opposite to the conductive structure 162. The conductive layer 18 may include a metal. The conductive layer 18 may include, for example, but is not limited to, copper (Cu), aluminum (Al), titanium (Ti), palladium (Pd), nickel (Ni), and wolfram (W). The conductive layer 18 may include a metal compound. The conductive layer 18 may include, for example, but is not limited to, titanium nitride (TiN) or metal silicide. The conductive layer 18 may be electrically connected to the conductive structure 171. The conductive layer 18 may be electrically connected to the conductive structure 172. The conductive layer 18 may be electrically connected to the conductive structure 173.

The component 2a may include a substrate 10, a passivation layer 15, a conductive layer 18, a doped semiconductor structure 21, a doped semiconductor structure 22, an insulation layer 23, a conductive structure 24, and a conductive structure 25.

The substrate 10 may include, for example, but is not limited to, silicon (Si), doped silicon (doped Si) or another semiconductor material. In some embodiments, the substrate 10 may include a p-type semiconductor material. The substrate 10 may include a p-type semiconductor material having a doping concentration of about $10^{17}$ cm$^{-3}$ to about $10^{21}$ cm$^{-3}$. The substrate 10 may include a p-type semiconductor material having a doping concentration of about $10^{19}$ cm$^{-3}$ to about $10^{21}$ cm$^{-3}$. The substrate 10 may include a p-type semiconductor material having a doping concentration of about $10^{20}$ cm$^{-3}$ to about $10^{21}$ cm$^{-3}$. In some embodiments, the substrate 10 may include a p-type doped silicon layer. In some embodiments, the substrate 10 may include a silicon layer doped with arsenic (As). In some embodiments, the substrate 10 may include a silicon layer doped with phosphorus (P). In some embodiments, the substrate 10 may include an n-type semiconductor material. The substrate 10 may include an n-type semiconductor material having a doping concentration of about $10^{17}$ cm$^{-3}$ to about $10^{21}$ cm$^{-3}$. The substrate 10 may include an n-type semiconductor material having a doping concentration of about $10^{19}$ cm$^{-3}$ to about $10^{21}$ cm$^{-3}$. The substrate 10 may include an n-type semiconductor material having a doping concentration of about $10^{20}$ cm$^{-3}$ to about $10^{21}$ cm$^{-3}$. In some embodiments, the substrate 10 may include an n-type doped silicon layer. In some embodiments, the substrate 10 may include a silicon layer doped with boron (B). In some embodiments, the substrate 10 may include a silicon layer doped with gallium (Ga).

The substrate 10 may be shared by the component 1a and the component 2a. The component 1a and the component 2a may be disposed on the substrate 10. The component 1a and the component 2a may be disposed on the single substrate 10.

The doped semiconductor structure 21 may be disposed in the substrate 10. The doped semiconductor structure 21 may be disposed in the substrate 10 and is close to an upper surface of the substrate 10. The doped semiconductor structure 21 may be formed in the substrate 10 by doping an n-type semiconductor material. The doped semiconductor structure 21 may be formed in the substrate 10 by doping an n-type semiconductor material by means of oblique multi-angle ion implanting. The doped semiconductor structure 21 may include at least one of phosphorus (P) and arsenic (As). The n-type semiconductor material of the doped semiconductor structure 21 may have a doping concentration of about $10^{14}$ cm$^{-3}$ to about $10^{17}$ cm$^{-3}$. The doped semiconductor structure 21 may be formed in the substrate 10 by doping a p-type semiconductor material. The doped semiconductor structure 21 may be formed in the substrate 10 by doping a p-type semiconductor material by means of oblique multi-angle ion implanting. The doped semiconductor structure 21 may include at least one of boron (B) and gallium (Ga). The p-type semiconductor material of the doped semiconductor structure 21 may have a doping concentration of about $10^{14}$ cm$^{-3}$ to about $10^{17}$ cm$^{-3}$. The doped semiconductor structure 21 and the substrate 10 may have different polarities. It should be noted that, if the substrate 10 is a p-type semiconductor and the doped semiconductor structure 21 is an n-type semiconductor, the doped semiconductor structure 21 and the substrate 10 may be regarded as having different polarities. It should be noted that, if the substrate 10 is an n-type semiconductor and the doped semiconductor structure 21 is a p-type semiconductor, the doped semiconductor structure 21 and the substrate 10 may be regarded as having different polarities. It should be noted that, if the substrate 10 is an undoped semiconductor (for example, intrinsic silicon) and the doped semiconductor structure 21 is a p-type semiconductor, the doped semiconductor structure 21 and the substrate 10 may be regarded as having different polarities. It should be noted that, if the substrate 10 is an undoped semiconductor (for example, intrinsic silicon) and the doped semiconductor structure 21 is an n-type semiconductor, the doped semiconductor structure 21 and the substrate 10 may be regarded as having different polarities. It should be noted that, if a concentration of a p-type dopant is greater than a concentration of an n-type dopant in the substrate 10, and a concentration of an n-type dopant is greater than a concentration of a p-type dopant in the doped semiconductor structure 21, the doped semiconductor structure 21 and the substrate 10 may be regarded as having different polarities. It should be noted that, if a concentration of an n-type dopant is greater than a concentration of a p-type dopant in the substrate 10, and a concentration of a p-type dopant is greater than a concentration of an n-type dopant in the doped semiconductor structure 21, the doped semiconductor structure 21 and the substrate 10 may be regarded as having different polarities.

The doped semiconductor structure 22 may be disposed in the substrate 10. The doped semiconductor structure 22 may be disposed in the substrate 10 and is close to an upper surface of the substrate 10. The doped semiconductor structure 22 may be located between the substrate 10 and the doped semiconductor structure 21. The doped semiconductor structure 22 may be formed in the substrate 10 by doping an n-type semiconductor material. The doped semiconductor structure 22 may be formed in the substrate 10 by doping an n-type semiconductor material by means of vertical ion implanting. The doped semiconductor structure 22 may include at least one of phosphorus (P) and arsenic (As). The n-type semiconductor material of the doped semiconductor structure 22 may have a higher doping concentration than the n-type semiconductor material of the doped semiconductor structure 21. The n-type semiconductor material of the doped semiconductor structure 22 may have a doping concentration of about $10^{17}$ cm$^{-3}$ to about $10^{21}$ cm$^{-3}$. The doped semiconductor structure 22 may be formed in the substrate 10 by doping a p-type semiconductor material. The doped semiconductor structure 22 may be formed in the substrate 10 by doping a p-type semiconductor material by means of vertical ion implanting. The doped semiconductor structure 22 may include at least one of boron (B) and gallium (Ga). The p-type semiconductor material of the doped semiconductor structure 22 may have a higher doping concentration than the p-type semiconductor material of the doped semiconductor structure 21. The p-type semiconductor material of the doped semiconductor structure 22 may have a doping concentration of about $10^{17}$ cm$^{-3}$ to about $10^{21}$ cm$^{-3}$. The doped semiconductor structure 22 and the doped semiconductor structure 21 may have the same polarity. The doped semiconductor structure 22 and the substrate 10 may have different polarities. It should be noted that, if the substrate 10 is a p-type semiconductor and the doped semiconductor structure 22 is an n-type semiconductor, the doped semiconductor structure 22 and the substrate 10 may be regarded as having different polarities. It should be noted that, if the substrate 10 is an n-type semiconductor and the doped semiconductor structure 22 is a p-type semiconductor, the doped semiconductor structure 22 and the substrate 10 may be regarded as having different polarities. It should be noted that, if the substrate 10 is an undoped semiconductor (for example, intrinsic silicon) and the doped semiconductor structure 22 is a p-type semiconductor, the doped semiconductor structure 22 and the substrate 10 may be regarded as having different polarities. It should be noted that, if the substrate 10 is an undoped semiconductor (for example, intrinsic silicon) and the doped semiconductor structure 22 is an n-type semiconductor, the doped semiconductor structure 22 and the substrate 10 may be regarded as having different polarities. It should be noted that, if a concentration of a p-type dopant is greater than a concentration of an n-type dopant in the substrate 10, and a concentration of an n-type dopant is greater than a concentration of a p-type dopant in the doped semiconductor structure 22, the doped semiconductor structure 22 and the substrate 10 may be regarded as having different polarities. It should be noted that, if a concentration of an n-type dopant is greater than a concentration of a p-type dopant in the substrate 10, and a concentration of a p-type dopant is greater than a concentration of an n-type dopant in the doped semiconductor structure 22, the doped semiconductor structure 22 and the substrate 10 may be regarded as having different polarities.

The insulation layer 23 may be disposed on the doped semiconductor structure 21. The insulation layer 23 may be disposed on the doped semiconductor structure 21 and cover the buffer layer 11. The insulation layer 23 may be disposed on the doped semiconductor structure 21 and cover the semiconductor layer 12. The insulation layer 23 may be disposed on the doped semiconductor structure 21 and cover the semiconductor layer 13. The insulation layer 23 may be disposed on the doped semiconductor structure 22. The insulation layer 23 may be disposed on the doped semiconductor structure 22 and cover the buffer layer 11. The insulation layer 23 may be disposed on the doped semiconductor structure 22 and cover the semiconductor layer 12. The insulation layer 23 may be disposed on the doped semiconductor structure 22 and cover the semiconductor layer 13. The insulation layer 23 may include a dielectric material. The insulation layer 23 may include nitride. The insulation layer 23 may include, for example, but is not limited to, silicon nitride ($Si_3N_4$). The insulation layer 23 may include oxide. The insulation layer 23 may include, for example, but is not limited to, silicon oxide ($SiO_2$).

The conductive structure 24 may be disposed on the doped semiconductor structure 21. The conductive structure 24 may be disposed on the doped semiconductor structure 22. The conductive structure 24 may be used as an ohmic contact electrically connected to the doped semiconductor structure 21. The conductive structure 24 may be used as an ohmic contact electrically connected to the doped semiconductor structure 22. The conductive structure 24 may be disposed on the doped semiconductor structure 21 and cover the insulation layer 23. The conductive structure 24 may be disposed on the doped semiconductor structure 22 and cover the insulation layer 23. The conductive structure 24 may include a metal. The conductive structure 24 may include, for example, but is not limited to, titanium (Ti). The conductive structure 24 may include, for example, but is not limited to, aluminum (Al). The conductive structure 24 may include, for example, but is not limited to, nickel (Ni).

The conductive structure 25 may be disposed on the conductive structure 24. The conductive structure 25 may be electrically connected to the conductive structure 24. The conductive structure 25 may be used as a through hole. The conductive structure 25 may include a through hole arranged on the conductive structure 24. The conductive structure 25 may be used as a through hole for electrically connecting the conductive structure 24 to the outside. The conductive structure 25 may be used as a through hole for electrically connecting the component 2a to the outside. The conductive structure 25 may be electrically connected to, for example, but is not limited to, the conductive structure 171 of the component 1a. The conductive structure 25 may be electrically connected to, for example, but is not limited to, the conductive structure 172 of the component 1a. The conductive structure 25 may be electrically connected to, for example, but is not limited to, the conductive structure 173 of the component 1a. The conductive structure 25 may include a metal. The conductive structure 25 may include a metal compound. The conductive structure 25 may include, for example, but is not limited to, copper (Cu), wolfram carbide (WC), titanium (Ti), titanium nitride (TiN) or aluminum copper (Al—Cu).

The passivation layer 15 may be disposed on the insulation layer 23. The passivation layer 15 may be used as an interlayer dielectric layer. The passivation layer 15 may surround the conductive structure 24. The passivation layer 15 may cover the conductive structure 24. The passivation layer 15 may surround the conductive structure 25. The passivation layer 15 may include a dielectric material. The passivation layer 15 may include nitride. The passivation layer 15 may include, for example, but is not limited to, silicon nitride ($Si_3N_4$). The passivation layer 15 may include oxide. The passivation layer 15 may include, for example, but is not limited to, silicon oxide ($SiO_2$). The passivation layer 15 may electrically isolate the conductive structure 24 from, for example, but is not limited to, the conductive structure 161 of the component 1a. The passivation layer 15 may electrically isolate the conductive structure 24 from, for example, but is not limited to, the conductive structure 162 of the component 1a. The passivation layer 15 may electrically isolate the conductive structure 24 from, for example, but is not limited to, the conductive structure 142 of the component 1a. The passivation layer 15 may electrically isolate the conductive structure 25 from, for example, but is not limited to, the conductive structure 171 of the component 1a. The passivation layer 15 may electrically isolate the conductive structure 25 from, for example, but is not limited to, the conductive structure 172 of the component 1a. The passivation layer 15 may electrically isolate the conductive structure 25 from, for example, but is not limited to, the conductive structure 173 of the component 1a.

The conductive layer 18 may be disposed below the substrate 10. The conductive layer 18 may be disposed below the substrate 10 so as to be opposite to the doped semiconductor structure 21. The conductive layer 18 may be disposed below the substrate 10 so as to be opposite to the doped semiconductor structure 22. The conductive layer 18 may be disposed below the substrate 10 so as to be opposite to the conductive structure 24. The conductive layer 18 may be disposed below the substrate 10 so as to be opposite to the conductive structure 25. The conductive layer 18 may include a metal. The conductive layer 18 may include, for example, but is not limited to, copper (Cu), aluminum (Al), titanium (Ti), palladium (Pd), nickel (Ni), and wolfram (W). The conductive layer 18 may include a metal compound. The conductive layer 18 may include, for example, but is not limited to, titanium nitride (TiN) or metal silicide. The conductive layer 18 may electrically connect the component 2a to the outside. The conductive layer 18 may electrically connect the component 2a to the conductive structure 171 of the component 1a. The conductive layer 18 may electrically connect the component 2a to the conductive structure 172 of the component 1a. The conductive layer 18 may electrically connect the component 2a to the conductive structure 173 of the component 1a.

In some embodiments, the component 2a may be used as a p-n junction diode. In some embodiments, if the substrate 10 includes a p-type doped semiconductor material, an n-type doped semiconductor structure 21, and an n-type doped semiconductor structure 22, the substrate 10 may be used as an anode of the p-n junction diode, and the n-type doped semiconductor structure 21 and the n-type doped semiconductor structure 22 may be used as a cathode of the p-n junction diode. In some embodiments, if the substrate 10 includes an n-type doped semiconductor material, a p-type doped semiconductor structure 21, and a p-type doped semiconductor structure 22, the substrate 10 may be used as a cathode of the p-n junction diode, and the p-type doped semiconductor structure 21 and the p-type doped semiconductor structure 22 may be used as an anode of the p-n junction diode.

Referring to FIG. 1A again, the component 1a and the component 2a may be built in the same substrate 10. The component 1a and the component 2a may be disposed on the same substrate 10. The component 1a and the component 2a may share the same substrate 10. The component 1a and the component 2a may include the same conductive layer 18. The component 1a and the component 2a may share the same conductive layer 18.

Figure 1B:
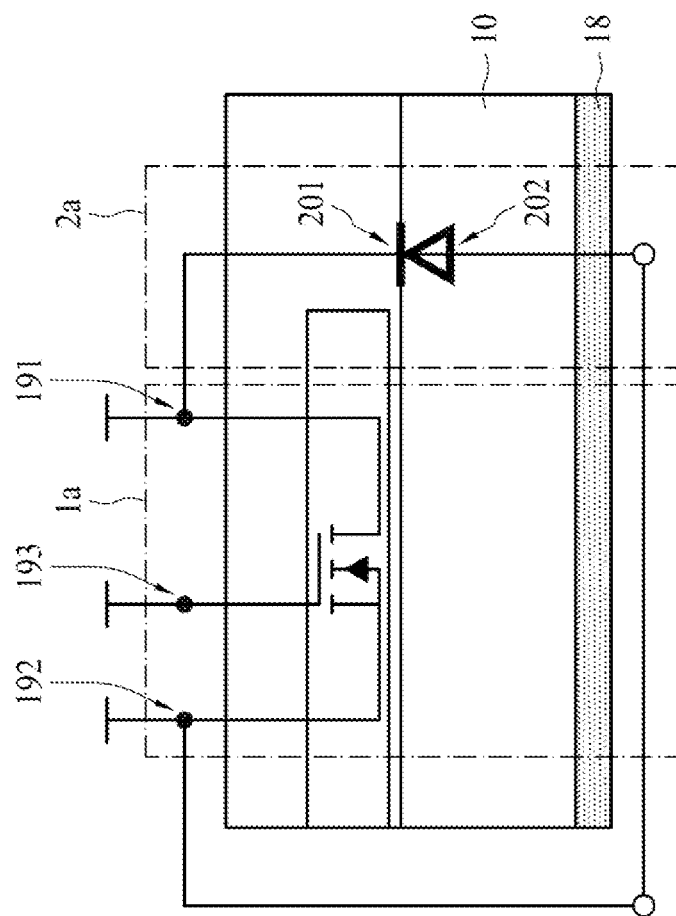
FIG. 1B is a side view of an equivalent circuit of a semiconductor device according to some embodiments of the disclosure.

FIG. 1B is a side view of an equivalent circuit drawn according to the semiconductor device of FIG. 1A.

The component 1a may include a contact 191, a contact 192, and a contact 193. The component 1a may include a contact 191, a contact 192, and a contact 193 of a semiconductor device. The component 1a may include a contact 191, a contact 192, and a contact 193 of a HEMT. In some embodiments, the contact 191 may be used as a drain contact of the HEMT, the contact 192 may be used as a source contact of the HEMT, and the contact 193 may be used as a gate contact of the HEMT.

The component 2a may include a cathode 201 and an anode 202. The component 2a may include a cathode 201 and an anode 202 of a semiconductor device. The component 2a may include a cathode 201 and an anode 202 of a diode. The component 2a may include a cathode 201 and an anode 202 of a p-n junction diode. The cathode 201 and the anode 202 may be disposed in the substrate 10. The cathode 201 may be far away from the conductive layer 18 opposite to the substrate 10. The anode 202 may be adjacent to the conductive layer 18.

In some embodiments, the contact 191 may be electrically connected to the cathode 201, and the contact 192 may be electrically connected to the anode 202. In some embodiments, the contact 191 may be electrically connected to the cathode 201, and the contact 192 may be electrically connected to the anode 202 through the conductive layer 18. In some embodiments, the drain contact 191 of the HEMT may be electrically connected to the cathode 201 of the p-n junction diode, and the source contact 192 of the HEMT may be electrically connected to the anode 202 of the p-n junction diode through the conductive layer 18.

Figure 1C:
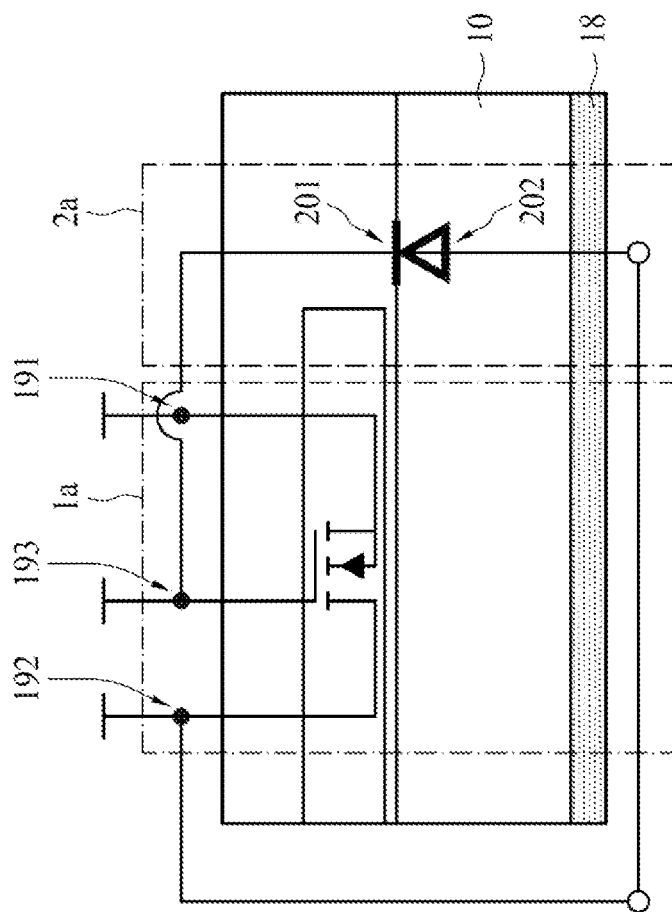
FIG. 1C is a side view of an equivalent circuit of a semiconductor device according to some embodiments of the disclosure.

FIG. 1C is a side view of an equivalent circuit drawn according to the semiconductor device of FIG. 1A.

The equivalent circuit shown in FIG. 1C is similar to the equivalent circuit shown in FIG. 1B, except that the contact 193 may be electrically connected to the cathode 201 in FIG. 1C.

As shown in FIG. 1C, the contact 193 may be electrically connected to the cathode 201, and the contact 192 may be electrically connected to the anode 202 through the conductive layer 18. In some embodiments, the gate contact 193 of the HEMT may be electrically connected to the cathode 201 of the p-n junction diode, and the source contact 192 of the HEMT may be electrically connected to the anode 202 of the p-n junction diode through the conductive layer 18.

Figure 2A:
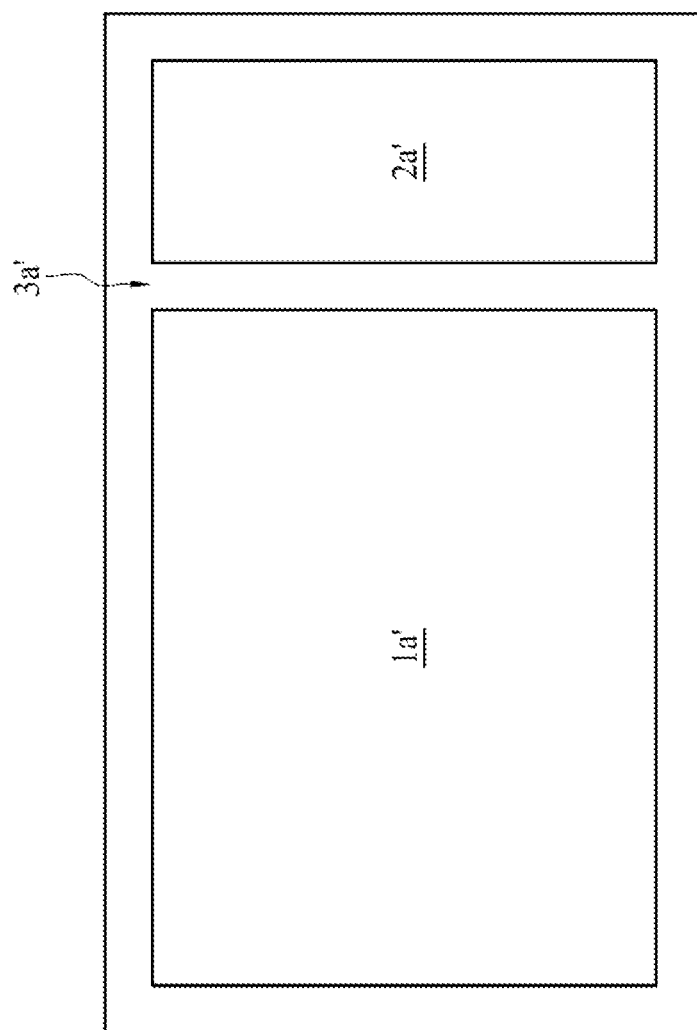
FIG. 2A is a top view of a semiconductor device according to some embodiments of the disclosure.

FIG. 2A is a top view of a semiconductor device according to some embodiments of the disclosure.

As shown in FIG. 2A, a semiconductor structure 1a' may include the plurality of components 1a shown in FIG. 1A. A semiconductor structure 2a' may include the plurality of components 2a shown in FIG. 1A. The semiconductor structure 1a' may be arranged side by side with the semiconductor structure 2a'. The semiconductor structure 1a' may be juxtaposed with the semiconductor structure 2a'. The semiconductor structure 1a' may be adjacent to the semiconductor structure 2a'. The semiconductor structure 1a' may be surrounded by a semiconductor structure 3a'. The semiconductor structure 2a' may be surrounded by the semiconductor structure 3a'. The semiconductor structure 1a' may be surrounded by the semiconductor structure 3a' to be electrically isolated from the semiconductor structure 2a'. The semiconductor structure 2a' may be surrounded by the semiconductor structure 3a' to be electrically isolated from the semiconductor structure 1a'.

The semiconductor structure 1a' may include at least one transistor. The semiconductor structure 1a' may include at least one HEMT.

The semiconductor structure 2a' may include at least one diode. The semiconductor structure 2a' may include at least one p-n junction diode.

The semiconductor structure 3a' may be disposed between the semiconductor structure 1a' and the semiconductor structure 2a'. The semiconductor structure 3a' may be located between the semiconductor structure 1a' and the semiconductor structure 2a'. The semiconductor structure 3a' may electrically isolate the semiconductor structure 1a' from the semiconductor structure 2a'. The semiconductor structure 3a' may be formed by doping an impurity. The semiconductor structure 3a' may be formed by doping an impurity in the semiconductor layer 12 shown in FIG. 1A. The semiconductor structure 3a' may be formed by doping, for example, but is not limited to, nitrogen (N) in the semiconductor layer 12 shown in FIG. 1A. The semiconductor structure 3a' may be formed by doping, for example, but is not limited to, oxygen (O) in the semiconductor layer 12 shown in FIG. 1A. The semiconductor structure 3a' may be formed by doping, for example, but is not limited to, fluorine (F) in the semiconductor layer 12 shown in FIG. 1A. The semiconductor structure 3a' may be formed by doping, for example, but is not limited to, magnesium (Mg) in the semiconductor layer 12 shown in FIG. 1A. The semiconductor structure 3a' may be formed by doping, for example, but is not limited to, calcium (Ca) in the semiconductor layer 12 shown in FIG. 1A. The semiconductor structure 3a' may eliminate the 2DEG in the semiconductor layer 12 shown in FIG. 1A by doping an impurity. The semiconductor structure 3a' may eliminate the 2DEG in the semiconductor layer 12 shown in FIG. 1A by doping an impurity, so as to electrically isolate the semiconductor structure 1a' from the semiconductor structure 2a'.

Figure 2B:
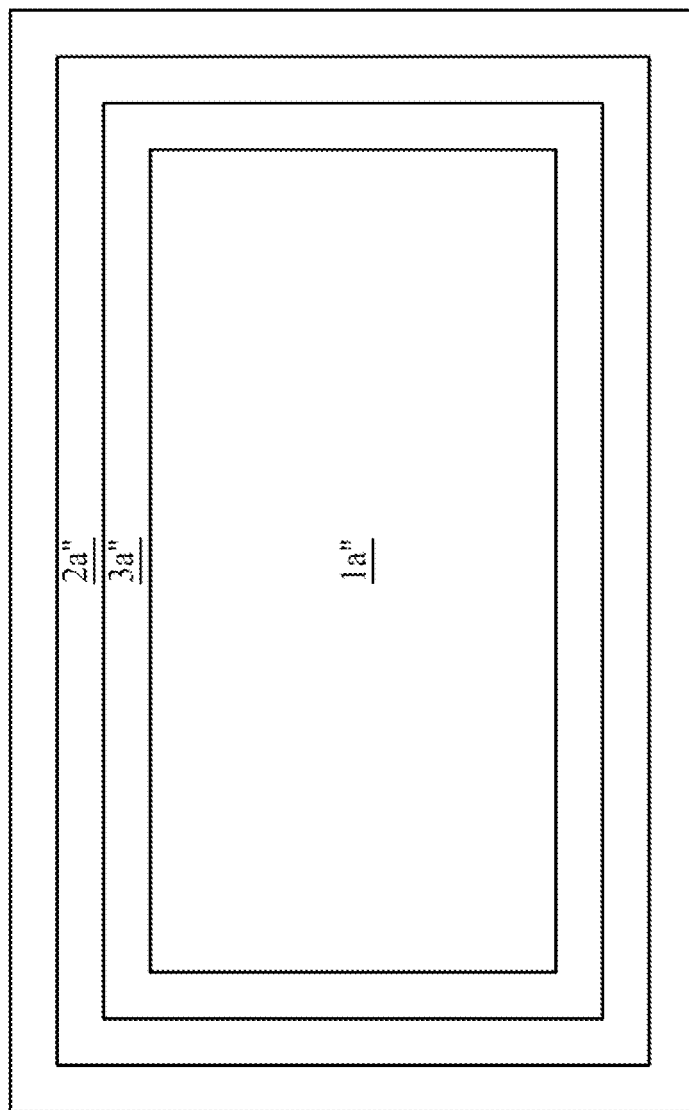
FIG. 2B is a top view of a semiconductor device according to some embodiments of the disclosure.

FIG. 2B is a top view of a semiconductor device according to some embodiments of the disclosure.

As shown in FIG. 2B, a semiconductor structure 1a" may include the plurality of components 1a shown in FIG. 1A. A semiconductor structure 2a" may include the plurality of components 2a shown in FIG. 1A. The semiconductor structure 1a" may be disposed in the semiconductor structure 2a". The semiconductor structure 1a" may be surrounded by the semiconductor structure 2a". The semiconductor structure 1a" may be encircled by the semiconductor structure 2a". The semiconductor structure 1a" may be surrounded by a semiconductor structure 3a". The semiconductor structure 1a" may be encircled by the semiconductor structure 3a". The semiconductor structure 2a" may surround the semiconductor structure 3a". The semiconductor structure 2a" may encircle the semiconductor structure 3a". The semiconductor structure 1a" may be surrounded by the semiconductor structure 3a" to be electrically isolated from the semiconductor structure 2a". The semiconductor structure 2a" may surround the semiconductor structure 3a" to be electrically isolated from the semiconductor structure 1a".

The semiconductor structure 1a" may include at least one transistor. The semiconductor structure 1a" may include at least one HEMT.

The semiconductor structure 2a" may include at least one diode. The semiconductor structure 2a" may include at least one p-n junction diode.

The semiconductor structure 3a" may be disposed between the semiconductor structure 1a" and the semiconductor structure 2a". The semiconductor structure 3a" may be located between the semiconductor structure 1a" and the semiconductor structure 2a". The semiconductor structure 3a" may electrically isolate the semiconductor structure 1a" from the semiconductor structure 2a". The semiconductor structure 3a" may be formed by doping an impurity. The semiconductor structure 3a" may be formed by doping an impurity in the semiconductor layer 12 shown in FIG. 1A. The semiconductor structure 3a" may be formed by doping, for example, but is not limited to, nitrogen (N) in the semiconductor layer 12 shown in FIG. 1A. The semiconductor structure 3a" may be formed by doping, for example, but is not limited to, oxygen (O) in the semiconductor layer 12 shown in FIG. 1A. The semiconductor structure 3a" may be formed by doping, for example, but is not limited to, fluorine (F) in the semiconductor layer 12 shown in FIG. 1A. The semiconductor structure 3a" may be formed by doping, for example, but is not limited to, magnesium (Mg) in the semiconductor layer 12 shown in FIG. 1A. The semiconductor structure 3a" may be formed by doping, for example, but is not limited to, calcium (Ca) in the semiconductor layer 12 shown in FIG. 1A. The semiconductor structure 3a" may eliminate the 2DEG in the semiconductor layer 12 shown in FIG. 1A by doping an impurity. The semiconductor structure 3a" may eliminate the 2DEG in the semiconductor layer 12 shown in FIG. 1A by doping an impurity, so as to electrically isolate the semiconductor structure 1a" from the semiconductor structure 2a".

FIG. 3A, FIG. 3B, FIG. 3C, FIG. 3D, FIG. 3E, and FIG. 3F show several operations for manufacturing a semiconductor device according to some embodiments of the disclosure. FIG. 3A, FIG. 3B, FIG. 3C, FIG. 3D, FIG. 3E, and FIG. 3F depict several operations for manufacturing the semiconductor device 1 shown in FIG. 1A.

Figure 3A:
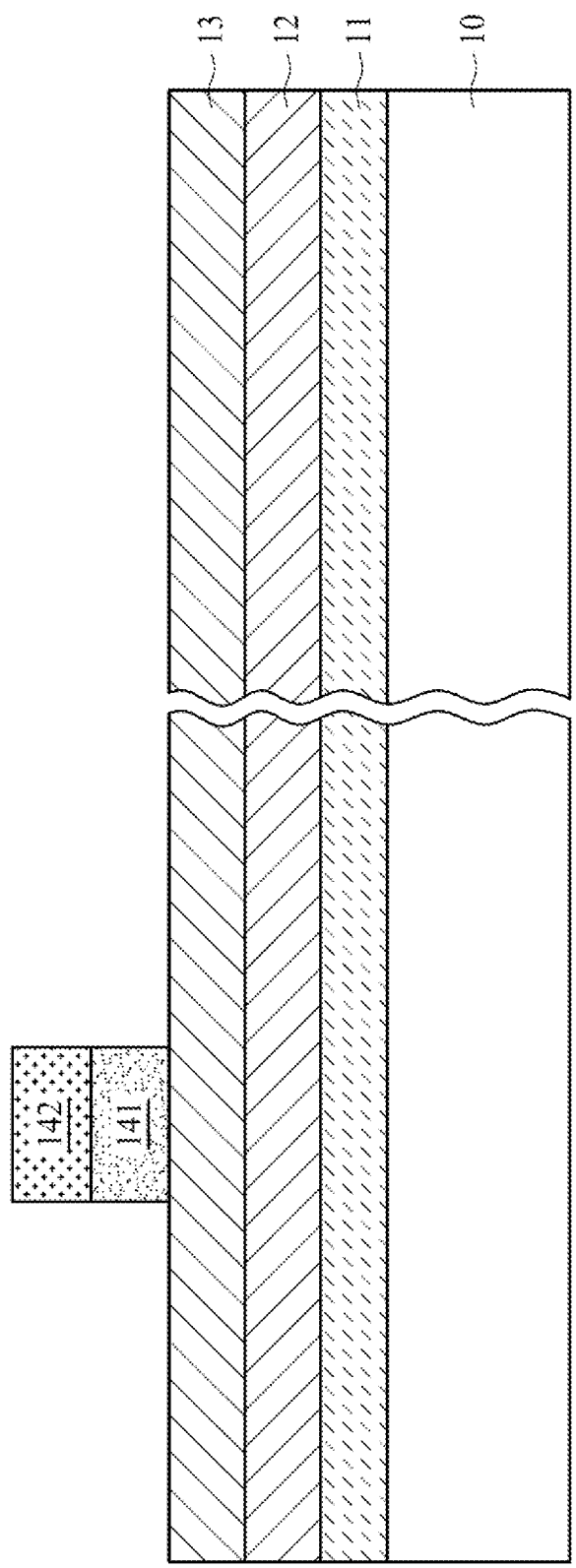
FIG. 3A, FIG. 3B, FIG. 3C, FIG. 3D, FIG. 3E, and FIG. 3F show several operations for manufacturing a semiconductor device according to some embodiments of the disclosure.

Referring to FIG. 3A, a substrate 10 is provided. In some embodiments, the substrate 10 may include a silicon substrate. In some embodiments, the substrate 10 may be doped with a dopant. In some embodiments, the substrate 10 may include a p-type semiconductor substrate. In some embodiments, the substrate 10 may be doped with at least one of boron (B) and gallium (Ga) to form a p-type semiconductor substrate. In some embodiments, the substrate 10 may include an n-type semiconductor substrate. In some embodiments, the substrate 10 may be doped with at least one of phosphorus (P) and arsenic (As) to form an n-type semiconductor substrate.

In some embodiments, a buffer layer 11 is disposed on the substrate 10. In some embodiments, the buffer layer 11 may be formed through chemical vapor deposition (CVD) and/or another suitable deposition step. In some embodiments, the buffer layer 11 may be formed on the substrate 10 through CVD and/or another suitable deposition step.

In some embodiments, a semiconductor layer 12 is disposed on the buffer layer 11. In some embodiments, the semiconductor layer 12 may be formed through CVD and/or another suitable deposition step. In some embodiments, the semiconductor layer 12 may be formed on the buffer layer 11 through CVD and/or another suitable deposition step.

In some embodiments, a semiconductor layer 13 is disposed on the semiconductor layer 12. In some embodiments, the semiconductor layer 13 may be formed through CVD and/or another suitable deposition step. In some embodiments, the semiconductor layer 13 may be formed on the semiconductor layer 12 through CVD and/or another suitable deposition step. It should be noted that, the semiconductor layer 13 may be formed after the semiconductor layer 12. It should be noted that, a heterojunction may be formed when the semiconductor layer 13 is disposed on the semiconductor layer 12. It should be noted that, a band gap of the formed semiconductor layer 13 may be larger than a band gap of the formed semiconductor layer 12. It should be noted that, due to the polarization phenomenon of the formed heterojunction between the semiconductor layer 13 and the semiconductor layer 12, 2DEG may be formed in the semiconductor layer 12 having a smaller band gap. It should be noted that, due to the polarization phenomenon of the formed heterojunction between the semiconductor layer 13 and the semiconductor layer 12, in the semiconductor layer 12 having a smaller band gap, 2DEG may be formed close to an interface between the semiconductor layer 12 and the semiconductor layer 13.

In some embodiments, a doped semiconductor layer 141 is disposed on the semiconductor layer 13. In some embodiments, a conductive structure 142 is disposed on the semiconductor layer 13. In some embodiments, a conductive structure 142 is disposed on the doped semiconductor layer 141.

In some embodiments, the doped semiconductor layer 141 may be formed through CVD and/or another suitable deposition step. In some embodiments, the doped semiconductor layer 141 may be formed on the semiconductor layer 13 through CVD and/or another suitable deposition step and patterning.

In some embodiments, the conductive structure 142 may be formed through CVD and/or another suitable deposition step. In some embodiments, the conductive structure 142 may be formed on the semiconductor layer 13 through CVD and/or another suitable deposition step and patterning. In some embodiments, the conductive structure 142 may be formed on the doped semiconductor layer 141 through CVD and/or another suitable deposition step and patterning.

Figure 3B:
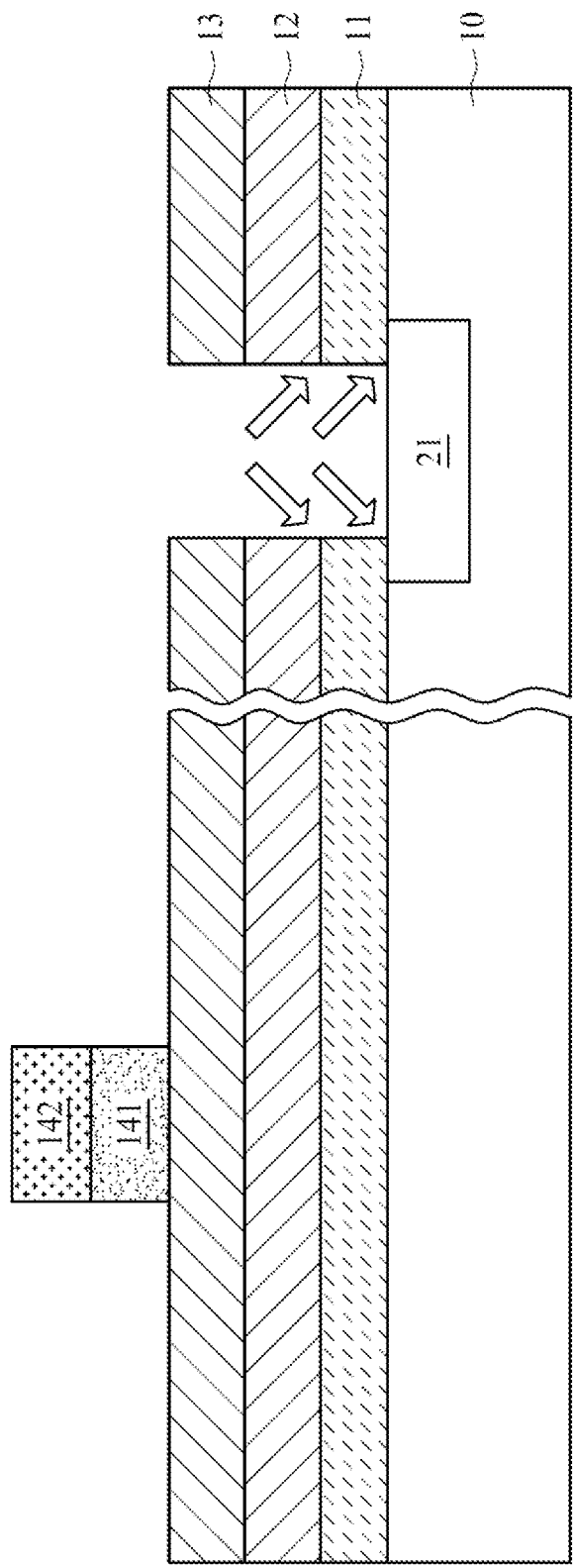

Referring to FIG. 3B, the buffer layer 11, the semiconductor layer 12, and the semiconductor layer 13 may be removed. In some embodiments, a part of the buffer layer 11, the semiconductor layer 12, and the semiconductor layer 13 may be removed. In some embodiments, a part of the buffer layer 11, the semiconductor layer 12, and the semiconductor layer 13 may be removed to form an exposed substrate 10. In some embodiments, a part of the buffer layer 11, the semiconductor layer 12, and the semiconductor layer 13 may be removed to expose a part of the substrate 10. In some embodiments, a part of the buffer layer 11, the semiconductor layer 12, and the semiconductor layer 13 may be etched to expose a part of the substrate 10.

In some embodiments, the exposed part of the substrate 10 may be doped. In some embodiments, the exposed part of the substrate 10 may be doped with a dopant. In some embodiments, the exposed part of the substrate 10 may be ion-implanted with a dopant to form a doped semiconductor structure 21. In some embodiments, the exposed part of the substrate 10 may be ion-implanted with a dopant obliquely to form a doped semiconductor structure 21. In some embodiments, the exposed part of the substrate 10 may be ion-implanted with a dopant at multiple angles to form a doped semiconductor structure 21. In some embodiments, the exposed part of the substrate 10 may be ion-implanted with a dopant obliquely at multiple angles to form a doped semiconductor structure 21.

In some embodiments, the doped semiconductor structure 21 may include an n-type semiconductor material. In some embodiments, the doped semiconductor structure 21 may include an n-type semiconductor material by doping at least one of phosphorus (P) and arsenic (As). In some embodiments, the n-type semiconductor material of the doped semiconductor structure 21 may have a doping concentration of about $10^{14}$ cm$^{-3}$ to about $10^{17}$ cm$^{-3}$. In some embodiments, the doped semiconductor structure 21 may include an n-type semiconductor material and the substrate 10 may include a p-type semiconductor substrate. In some embodiments, the doped semiconductor structure 21 and the substrate 10 may have different polarities.

In some embodiments, the doped semiconductor structure 21 may include a p-type semiconductor material. In some embodiments, the doped semiconductor structure 21 may include a p-type semiconductor material by doping at least one of boron (B) and gallium (Ga). In some embodiments, the p-type semiconductor material of the doped semiconductor structure 21 may have a doping concentration of about $10^{14}$ cm$^{-3}$ to about $10^{17}$ cm$^{-3}$. In some embodiments, the doped semiconductor structure 21 may include a p-type semiconductor material and the substrate 10 may include an n-type semiconductor substrate. In some embodiments, the doped semiconductor structure 21 and the substrate 10 may have different polarities.

Figure 3C:
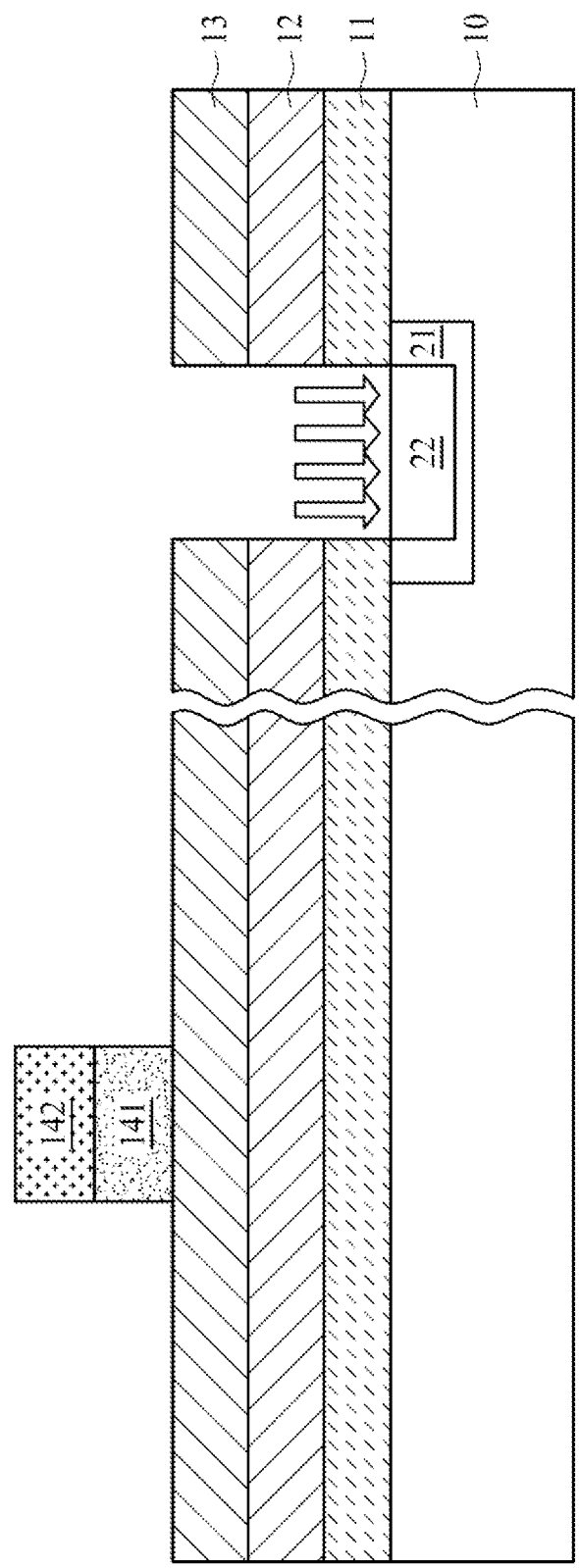

Referring to FIG. 3C, the doped semiconductor structure 22 may be formed on the doped semiconductor structure 21. In some embodiments, the doped semiconductor structure 22 may be formed in the doped semiconductor structure 21. In some embodiments, the exposed part of the substrate 10 may be doped. In some embodiments, the doped semiconductor structure 21 may further be doped. In some embodiments, the exposed part of the substrate 10 may be doped with a dopant. In some embodiments, the doped semiconductor structure 21 may further be doped with a dopant. In some embodiments, the exposed part of the substrate 10 may be ion-implanted with a dopant to form a doped semiconductor structure 22. In some embodiments, the doped semiconductor structure 21 may further be ion-implanted with a dopant to form a doped semiconductor structure 22. In some embodiments, the exposed part of the substrate 10 may be ion-implanted with a dopant vertically to form a doped semiconductor structure 22. In some embodiments, the doped semiconductor structure 21 may further be ion-implanted with a dopant vertically to form a doped semiconductor structure 22.

In some embodiments, the doped semiconductor structure 22 may include an n-type semiconductor material. In some embodiments, the doped semiconductor structure 22 may include an n-type semiconductor material by doping at least one of phosphorus (P) and arsenic (As). In some embodiments, the n-type semiconductor material of the doped semiconductor structure 22 may have a doping concentration of about $10^{17}$ cm$^{-3}$ to about $10^{21}$ cm$^{-3}$. In some embodiments, the doped semiconductor structure 22 may include an n-type semiconductor material and the substrate 10 may include a p-type semiconductor substrate. In some embodiments, the doped semiconductor structure 22 and the substrate 10 may have different polarities. In some embodiments, the doped semiconductor structure 22 and the doped semiconductor structure 21 may have the same polarity. In some embodiments, the doped semiconductor structure 22 and the doped semiconductor structure 21 may have the same doping concentration. In some embodiments, the doped semiconductor structure 22 and the doped semiconductor structure 21 may have different doping concentrations. In some embodiments, the doped semiconductor structure 22 may have a higher doping concentration than the doped semiconductor structure 21. In some embodiments, if the substrate 10 includes a p-type semiconductor material, and the doped semiconductor structure 21 and the doped semiconductor structure 22 include n-type semiconductor materials, the substrate 10, the doped semiconductor structure 21, and the doped semiconductor structure 22 may form a p-n junction diode, the substrate 10 may be used as an anode of the p-n junction diode, and the doped semiconductor structure 21 and the doped semiconductor structure 22 may be used as a cathode of the p-n junction diode.

In some embodiments, the doped semiconductor structure 22 may include a p-type semiconductor material. In some embodiments, the doped semiconductor structure 22 may include a p-type semiconductor material by doping at least one of boron (B) and gallium (Ga). In some embodiments, the p-type semiconductor material of the doped semiconductor structure 22 may have a doping concentration of about $10^{17}$ cm$^{-3}$ to about $10^{21}$ cm$^{-3}$. In some embodiments, the doped semiconductor structure 22 may include a p-type semiconductor material and the substrate 10 may include an n-type semiconductor substrate. In some embodiments, the doped semiconductor structure 22 and the substrate 10 may have different polarities. In some embodiments, the doped semiconductor structure 22 and the doped semiconductor structure 21 may have the same polarity. In some embodiments, the doped semiconductor structure 22 and the doped semiconductor structure 21 may have the same doping concentration. In some embodiments, the doped semiconductor structure 22 and the doped semiconductor structure 21 may have different doping concentrations. In some embodiments, the doped semiconductor structure 22 may have a higher doping concentration than the doped semiconductor structure 21.

In some embodiments, if the substrate 10 includes an n-type semiconductor material, and the doped semiconductor structure 21 and the doped semiconductor structure 22 include p-type semiconductor materials, the substrate 10, the doped semiconductor structure 21, and the doped semiconductor structure 22 may form a p-n junction diode, the substrate 10 may be used as a cathode of the p-n junction diode, and the doped semiconductor structure 21 and the doped semiconductor structure 22 may be used as an anode of the p-n junction diode.

Figure 3D:
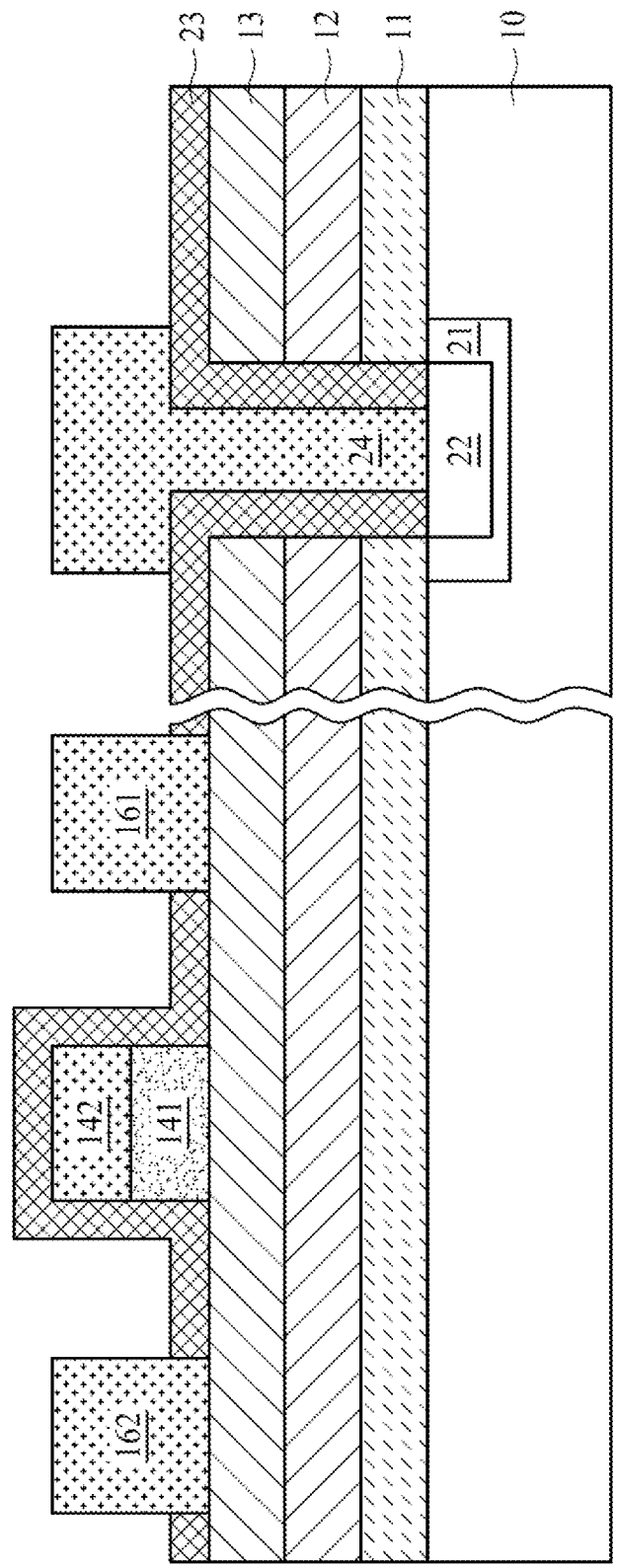

Referring to FIG. 3D, the insulation layer 23 may be formed on the semiconductor layer 13. In some embodiments, the insulation layer 23 may be formed through a deposition step. In some embodiments, the insulation layer 23 may be deposited on the semiconductor layer 13. In some embodiments, the insulation layer 23 may be deposited on the semiconductor layer 13 through CVD and/or another suitable deposition step. In some embodiments, the insulation layer 23 may be formed on the substrate 10. In some embodiments, the insulation layer 23 may be deposited on the substrate 10. In some embodiments, the insulation layer 23 may be deposited on the substrate 10 through CVD and/or another suitable deposition step. In some embodiments, the insulation layer 23 may be formed on the doped semiconductor structure 22. In some embodiments, the insulation layer 23 may be deposited on the doped semiconductor structure 22. In some embodiments, the insulation layer 23 may be deposited on the doped semiconductor structure 22 through CVD and/or another suitable deposition step. In some embodiments, the insulation layer 23 may be formed on the doped semiconductor layer 141. In some embodiments, the insulation layer 23 may be deposited on the doped semiconductor layer 141. In some embodiments, the insulation layer 23 may be deposited on the doped semiconductor layer 141 through CVD and/or another suitable deposition step. In some embodiments, the insulation layer 23 may be formed on the conductive structure 142. In some embodiments, the insulation layer 23 may be deposited on the conductive structure 142. In some embodiments, the insulation layer 23 may be deposited on the conductive structure 142 through CVD and/or another suitable deposition step. In some embodiments, the insulation layer 23 may cover the conductive structure 142.

Referring to FIG. 3D again, the conductive structure 161 may be formed on the semiconductor layer 13. The conductive structure 161 may be formed on the semiconductor layer 13 and encircled by the insulation layer 23. The conductive structure 161 may be formed on the semiconductor layer 13 and surrounded by the insulation layer 23. In some embodiments, the conductive structure 161 may be formed through a deposition step. In some embodiments, the conductive structure 161 may be deposited on the semiconductor layer 13. In some embodiments, the conductive structure 161 may be deposited on the semiconductor layer 13 through CVD and/or another suitable deposition step.

Referring to FIG. 3D again, the conductive structure 162 may be formed on the semiconductor layer 13. The conductive structure 162 may be formed on the semiconductor layer 13 and encircled by the insulation layer 23. The conductive structure 162 may be formed on the semiconductor layer 13 and surrounded by the insulation layer 23. In some embodiments, the conductive structure 162 may be formed through a deposition step. In some embodiments, the conductive structure 162 may be deposited on the semiconductor layer 13. In some embodiments, the conductive structure 162 may be deposited on the semiconductor layer 13 through CVD and/or another suitable deposition step.

Referring to FIG. 3D again, the conductive structure 24 may be formed on the substrate 10. The conductive structure 24 may be formed on the doped semiconductor structure 21. The conductive structure 24 may be formed on the doped semiconductor structure 22. The conductive structure 24 may be formed on the doped semiconductor structure 22 and cover the insulation layer 23. In some embodiments, the conductive structure 24 may be formed through a deposition step. In some embodiments, the conductive structure 24 may be deposited on the doped semiconductor structure 22. In some embodiments, the conductive structure 24 may be deposited on the doped semiconductor structure 22 through CVD and/or another suitable deposition step.

Figure 3E:
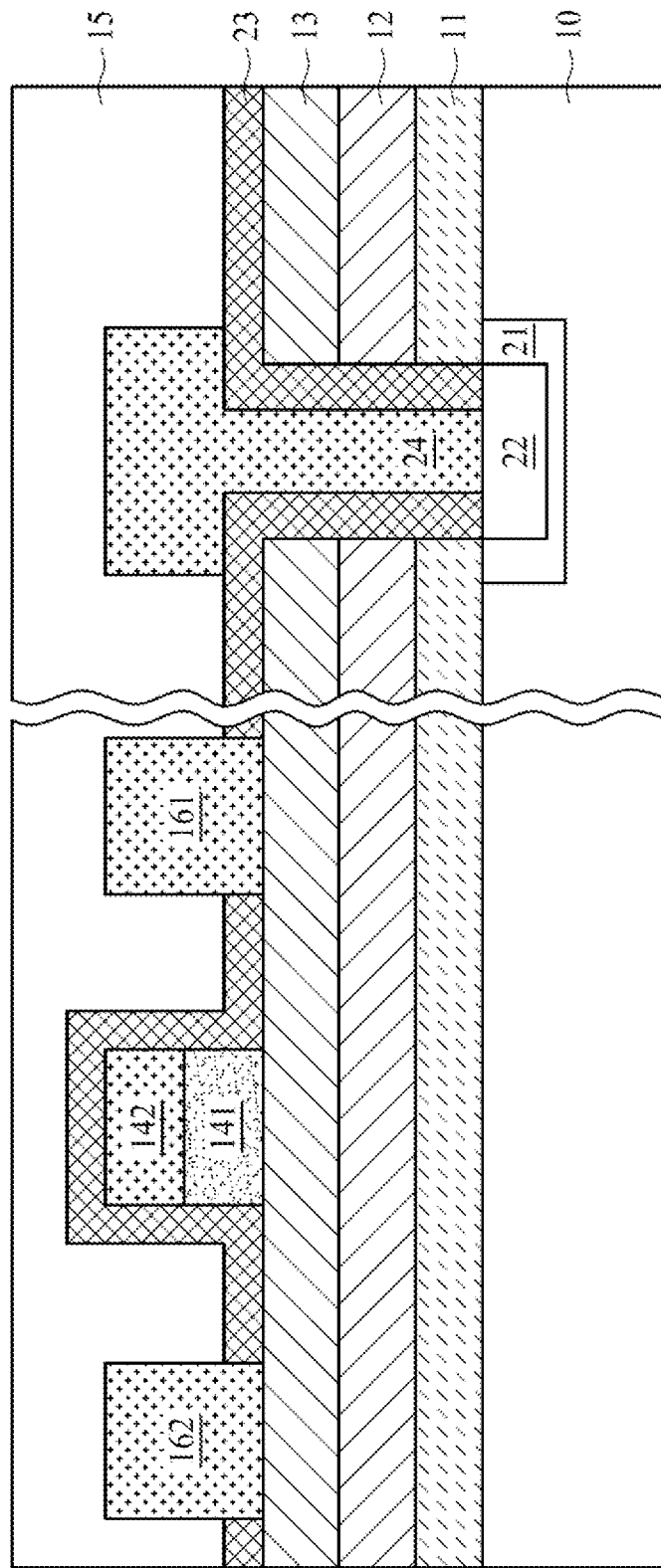

Referring to FIG. 3E, the passivation layer 15 may be formed on the insulation layer 23. The passivation layer 15 may be formed through a deposition step. In some embodiments, the passivation layer 15 may be deposited on the insulation layer 23. In some embodiments, the passivation layer 15 may be deposited on the insulation layer 23 through CVD and/or another suitable deposition step. In some embodiments, the passivation layer 15 may be deposited on the insulation layer 23 through CVD and/or another suitable deposition step and encircle the conductive structure 142.

Referring to FIG. 3E again, the passivation layer 15 may be formed on the conductive structure 161. The passivation layer 15 may be formed through a deposition step. In some embodiments, the passivation layer 15 may be deposited on the conductive structure 161. In some embodiments, the passivation layer 15 may be deposited on the conductive structure 161 through CVD and/or another suitable deposition step. In some embodiments, the passivation layer 15 may be deposited on the conductive structure 161 through CVD and/or another suitable deposition step and cover the conductive structure 161.

Referring to FIG. 3E again, the passivation layer 15 may be formed on the conductive structure 162. The passivation layer 15 may be formed through a deposition step. In some embodiments, the passivation layer 15 may be deposited on the conductive structure 162. In some embodiments, the passivation layer 15 may be deposited on the conductive structure 162 through CVD and/or another suitable deposition step. In some embodiments, the passivation layer 15 may be deposited on the conductive structure 162 through CVD and/or another suitable deposition step and cover the conductive structure 162.

Referring to FIG. 3E again, the passivation layer 15 may be formed on the conductive structure 24. The passivation layer 15 may be formed through a deposition step. In some embodiments, the passivation layer 15 may be deposited on the conductive structure 24. In some embodiments, the passivation layer 15 may be deposited on the conductive structure 24 through CVD and/or another suitable deposition step. In some embodiments, the passivation layer 15 may be deposited on the conductive structure 24 through CVD and/or another suitable deposition step and cover the conductive structure 24.

Figure 3F:
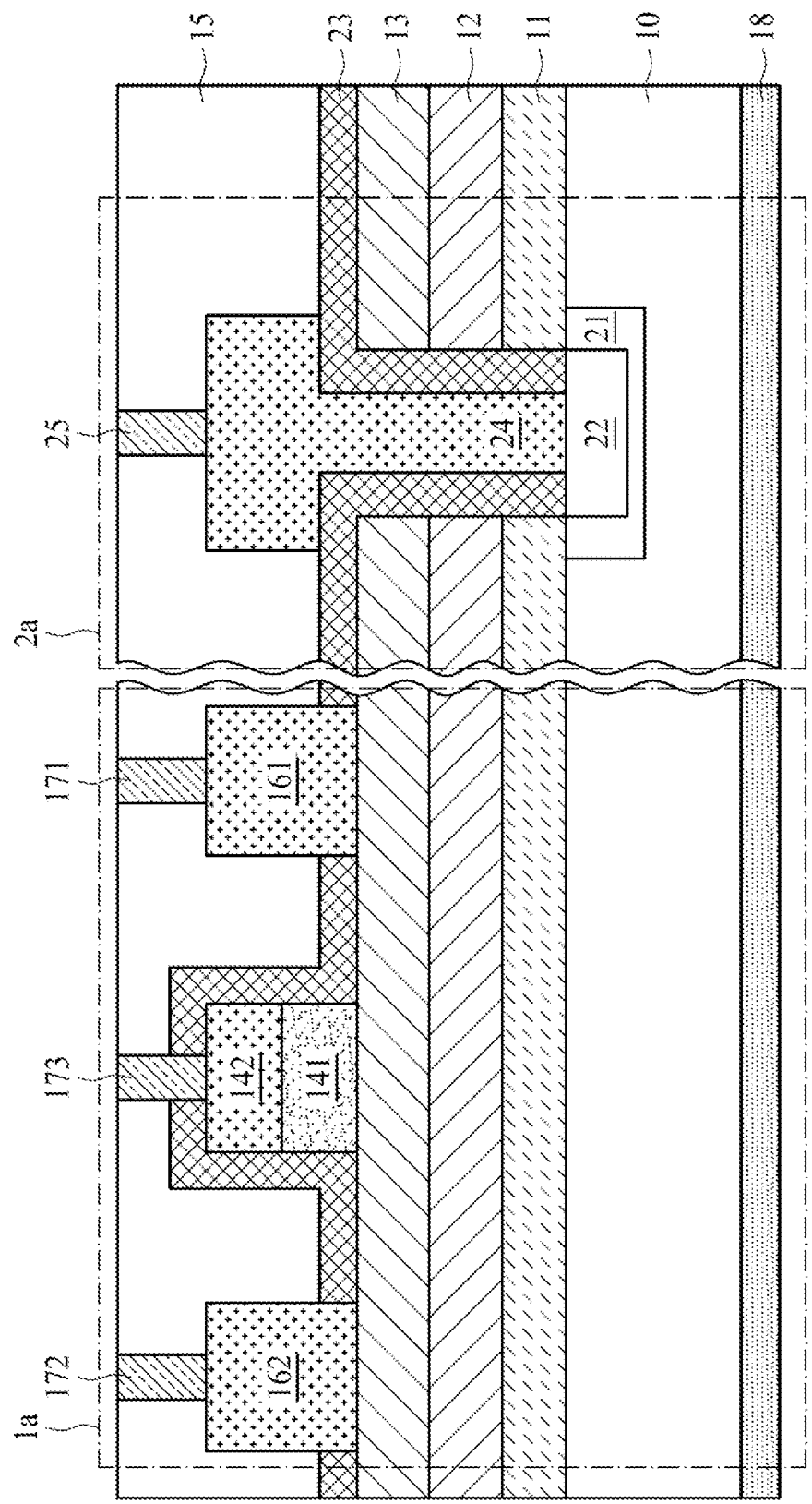

Referring to FIG. 3F, the conductive structure 171 may be formed on the conductive structure 161. In some embodiments, the conductive structure 171 may be formed on the conductive structure 161 by removing a part of the passivation layer 15. In some embodiments, the conductive structure 171 may be formed through CVD, physical vapor deposition (PVD), atomic layer deposition (ALD), plating, and/or another suitable step. In some embodiments, the conductive structure 171 may be formed on the conductive structure 161 through PVD and/or another suitable deposition step.

Referring to FIG. 3F again, the conductive structure 172 may be formed on the conductive structure 162. In some embodiments, the conductive structure 172 may be formed on the conductive structure 162 by removing a part of the passivation layer 15. In some embodiments, the conductive structure 172 may be formed through CVD, PVD, ALD, plating, and/or another suitable step. In some embodiments, the conductive structure 172 may be formed on the conductive structure 162 through PVD and/or another suitable deposition step.

Referring to FIG. 3F again, the conductive structure 173 may be formed on the conductive structure 142. In some embodiments, the conductive structure 173 may be formed on the conductive structure 142 by removing a part of the passivation layer 15. In some embodiments, the conductive structure 173 may be formed on the conductive structure 142 by removing a part of the passivation layer 15 and a part of the insulation layer 23. In some embodiments, the conductive structure 173 may be formed through CVD, PVD, ALD, plating, and/or another suitable step. In some embodiments, the conductive structure 173 may be formed on the conductive structure 142 through PVD and/or another suitable deposition step.

Referring to FIG. 3F again, the conductive structure 25 may be formed on the conductive structure 24. In some embodiments, the conductive structure 25 may be formed on the conductive structure 24 by removing a part of the passivation layer 15. In some embodiments, the conductive structure 25 may be formed through CVD, PVD, ALD, plating, and/or another suitable step. In some embodiments, the conductive structure 25 may be formed on the conductive structure 24 through PVD and/or another suitable deposition step.

Referring to FIG. 3F again, the conductive layer 18 may be formed below the substrate 10. In some embodiments, the conductive layer 18 may be formed below the substrate 10 so as to be opposite to the buffer layer 11. In some embodiments, the conductive layer 18 may be formed below the substrate 10 so as to be opposite to the semiconductor layer 12. In some embodiments, the conductive layer 18 may be formed below the substrate 10 so as to be opposite to the semiconductor layer 13. In some embodiments, the conductive layer 18 may be formed below the substrate 10 so as to be opposite to the doped semiconductor layer 141. In some embodiments, the conductive layer 18 may be formed below the substrate 10 so as to be opposite to the conductive structure 142. In some embodiments, the conductive layer 18 may be formed below the substrate 10 so as to be opposite to the passivation layer 15. In some embodiments, the conductive layer 18 may be formed below the substrate 10 so as to be opposite to the conductive structure 161. In some embodiments, the conductive layer 18 may be formed below the substrate 10 so as to be opposite to the conductive structure 162. In some embodiments, the conductive layer 18 may be formed below the substrate 10 so as to be opposite to the conductive structure 171, the conductive structure 172, and the conductive structure 173. In some embodiments, the conductive layer 18 may be formed below the substrate 10 so as to be opposite to the doped semiconductor structure 21. In some embodiments, the conductive layer 18 may be formed below the substrate 10 so as to be opposite to the doped semiconductor structure 22. In some embodiments, the conductive layer 18 may be formed below the substrate 10 so as to be opposite to the insulation layer 23. In some embodiments, the conductive layer 18 may be formed below the substrate 10 so as to be opposite to the conductive structure 24. In some embodiments, the conductive layer 18 may be formed below the substrate 10 so as to be opposite to the conductive structure 25.

In some embodiments, the conductive layer 18 may be formed through CVD, PVD, ALD, plating, and/or another suitable step. In some embodiments, the conductive layer 18 may be formed below the substrate 10 through PVD and/or another suitable deposition step.

Referring to FIG. 3F again, the formed component 1a may include a substrate 10, a buffer layer 11, a semiconductor layer 12, a semiconductor layer 13, a doped semiconductor layer 141, a conductive structure 142, a passivation layer 15, a conductive structure 161, a conductive structure 162, a conductive structure 171, a conductive structure 172, a conductive structure 173, a conductive layer 18, and an insulation layer 23. The formed component 2a may include a substrate 10, a passivation layer 15, a conductive layer 18, a doped semiconductor structure 21, a doped semiconductor structure 22, an insulation layer 23, a conductive structure 24, and a conductive structure 25. The component 1a and the component 2a may be built on the same substrate 10. The component 1a and the component 2a may be disposed on the same the substrate 10. The component 1a and the component 2a may share the same substrate 10.

The component 1a may include a transistor. The component 1a may include, for example, but is not limited to, a HEMT.

The component 2a may include a diode. The component 2a may include, for example, but is not limited to, a p-n junction diode.

In some embodiments, the conductive structure 161 may be used as a drain conductor of the component 1a, the conductive structure 162 may be used as a source conductor of the component 1a, the conductive structure 142 may be used as a gate conductor of the component 1a, the doped semiconductor structure 21 and the doped semiconductor structure 22 may be used as a cathode of the component 2a, and the substrate 10 may be used as an anode of the component 2a, where the conductive structure 162 as a source conductor may be electrically connected to the substrate 10 as an anode, and the conductive structure 161 as a drain conductor may be electrically connected to the doped semiconductor structure 21 and the doped semiconductor structure 22 as a cathode. In some embodiments, the conductive structure 162 as a source conductor may be electrically connected to the substrate 10 as an anode through at least the conductive structure 172 and the conductive layer 18, and the conductive structure 161 as a drain conductor may be electrically connected to the doped semiconductor structure 21 and the doped semiconductor structure 22 as a cathode through at least the conductive structure 171 and the conductive structure 25.

In some embodiments, the conductive structure 161 may be used as a source conductor of the component 1a, the conductive structure 162 may be used as a drain conductor of the component 1a, the conductive structure 142 may be used as a gate conductor of the component 1a, the doped semiconductor structure 21 and the doped semiconductor structure 22 may be used as an anode of the component 2a, and the substrate 10 may be used as a cathode of the component 2a, where the conductive structure 162 as a drain conductor may be electrically connected to the substrate 10 as a cathode, and the conductive structure 161 as a source conductor may be electrically connected to the doped semiconductor structure 21 and the doped semiconductor structure 22 as an anode. In some embodiments, the conductive structure 162 as a drain conductor may be electrically connected to the substrate 10 as a cathode through at least the conductive structure 172 and the conductive layer 18, and the conductive structure 161 as a source conductor may be electrically connected to the doped semiconductor structure 21 and the doped semiconductor structure 22 as an anode through at least the conductive structure 171 and the conductive structure 25.

In some embodiments, the conductive structure 161 may be used as a drain conductor of the component 1a, the conductive structure 162 may be used as a source conductor of the component 1a, the conductive structure 142 may be used as a gate conductor of the component 1a, the doped semiconductor structure 21 and the doped semiconductor structure 22 may be used as a cathode of the component 2a, and the substrate 10 may be used as an anode of the component 2a, where the conductive structure 162 as a source conductor may be electrically connected to the substrate 10 as an anode, and the conductive structure 142 as a gate conductor may be electrically connected to the doped semiconductor structure 21 and the doped semiconductor structure 22 as a cathode. In some embodiments, the conductive structure 162 as a source conductor may be electrically connected to the substrate 10 as an anode through at least the conductive structure 172 and the conductive layer 18, and the conductive structure 142 as a gate conductor may be electrically connected to the doped semiconductor structure 21 and the doped semiconductor structure 22 as a cathode through at least the conductive structure 173 and the conductive structure 25.

In some embodiments, the conductive structure 161 may be used as a source conductor of the component 1a, the conductive structure 162 may be used as a drain conductor of the component 1a, the conductive structure 142 may be used as a gate conductor of the component 1a, the doped semiconductor structure 21 and the doped semiconductor structure 22 may be used as an anode of the component 2a, and the substrate 10 may be used as a cathode of the component 2a, where the conductive structure 142 as a gate conductor may be electrically connected to the substrate 10 as a cathode, and the conductive structure 161 as a source conductor may be electrically connected to the doped semiconductor structure 21 and the doped semiconductor structure 22 as an anode. In some embodiments, the conductive structure 142 as a gate conductor may be electrically connected to the substrate 10 as a cathode through at least the conductive structure 173 and the conductive layer 18, and the conductive structure 161 as a source conductor may be electrically connected to the doped semiconductor structure 21 and the doped semiconductor structure 22 as an anode through at least the conductive structure 171 and the conductive structure 25.

As used herein, for ease of description, space-related terms such as "under", "below", "lower portion", "above", "upper portion", "lower portion", "left side", "right side", and the like may be used herein to describe a relationship between one component or feature and another component or feature as shown in the figures. In addition to orientations shown in the figures, space-related terms are intended to encompass different orientations of the device in use or operation. A device may be oriented in other ways (rotated 90 degrees or at other orientations), and the space-related descriptors used herein may also be used for explanation accordingly. It should be understood that when a component is "connected" or "coupled" to another component, the component may be directly connected to or coupled to another component, or an intermediate component may exist.

As used herein, terms "approximately", "basically", "substantially", and "about" are used for describing and considering a small variation. When being used in combination with an event or circumstance, the term may refer to a case in which the event or circumstance occurs precisely, and a case in which the event or circumstance occurs approximately. As used herein with respect to a given value or range, the term "about" generally means in the range of 10%, ±5%, ±1%, or +0.5% of the given value or range. The range may be indicated herein as from one endpoint to another endpoint or between two endpoints. Unless otherwise specified, all the ranges disclosed in the disclosure include endpoints. The term "substantially coplanar" may refer to two surfaces within a few micrometers (μm) positioned along the same plane, for example, within 10 μm, within 5 μm, within 1 μm, or within 0.5 μm located along the same plane. When reference is made to "substantially" the same numerical value or characteristic, the term may refer to a value within +10%, +5%, +1%, or +0.5% of the average of the values.

Several embodiments of the disclosure and features of details are briefly described above. The embodiments described in the disclosure may be easily used as a basis for designing or modifying other processes and structures for realizing the same or similar objectives and/or obtaining the same or similar advantages introduced in the embodiments of the disclosure. Such equivalent constructions do not depart from the spirit and scope of the disclosure, and various variations, replacements, and modifications can be made without departing from the spirit and scope of the disclosure.

What is claimed is:

1. A semiconductor device, comprising:
   a doped substrate;
   a conductive layer disposed below the doped substrate;
   a barrier layer disposed on the doped substrate;
   a channel layer disposed between the doped substrate and the barrier layer, wherein a bandgap of the barrier layer is greater than a bandgap of the channel layer;
   a drain electrode disposed on the barrier layer and spaced away from a conductive structure laterally;
   a doped semiconductor structure embedded in the doped substrate, wherein the doped substrate and the doped semiconductor structure have different polarities, so as to form a diode therebetween;
   the conductive structure having a first top surface and a second bottom surface, disposed over the doped substrate and making contact with the doped semiconductor structure, wherein the conductive structure extends from the doped semiconductor structure to a position higher than the channel layer and the barrier layer;

wherein the first top surface has a width greater than a width of the second bottom surface, wherein the second bottom surface and a top surface of the doped semiconductor structure are coplanar with a top surface of the doped substrate, wherein the doped semiconductor structure comprises a first doped semiconductor portion and a second doped semiconductor portion located between the doped substrate and the first doped semiconductor portion, wherein the drain electrode is electrically connected to a cathode of the diode via the conductive layer.

2. The semiconductor device according to claim 1, wherein the conductive structure has a width less than a width of the doped semiconductor structure.

3. The semiconductor device according to claim 1, wherein an interface between the doped semiconductor structure and the conductive structure is narrower than the doped semiconductor structure.

4. The semiconductor device according to claim 1, wherein the conductive structure is in contact with the first doped semiconductor portion and is spaced away from the second doped semiconductor portion.

5. The semiconductor device according to claim 1, wherein the first doped semiconductor portion has a doping concentration higher than a doping concentration of the second doped semiconductor portion.

6. The semiconductor device according to claim 1, wherein the first doped semiconductor portion is enclosed by the second doped semiconductor portion.

7. The semiconductor device according to claim 1, wherein top surfaces of the first and second doped semiconductor portions are coplanar with each other.

8. A semiconductor device, comprising:
a doped substrate;
a conductive layer disposed below the doped substrate;
a barrier layer disposed on the doped substrate;
a channel layer disposed between the doped substrate and the barrier layer, wherein a bandgap of the barrier layer is greater than a bandgap of the channel layer;
a drain electrode disposed on the barrier layer and spaced away from a first conductive structure laterally;
a doped semiconductor structure embedded in the doped substrate;
the first conductive structure having a first top surface and a second bottom surface, disposed over the doped substrate and making contact with the doped semiconductor structure;
a gate conductor disposed over the channel layer;
a second conductive structure disposed over the channel layer and between the first conductive structure and the gate conductor;
wherein the first top surface has a width greater than a width of the second bottom surface,
wherein the second bottom surface and a top surface of the doped semiconductor structure are coplanar with a top surface of the doped substrate,
wherein the doped semiconductor structure comprises a first doped semiconductor portion and a second doped semiconductor portion located between the doped substrate and the first doped semiconductor portion,
wherein the drain electrode is electrically connected to a cathode of a diode formed between the doped substrate and the doped semiconductor structure via the conductive layer.

9. The semiconductor device according to claim 8, wherein the first conductive structure has a width less than a width of the doped semiconductor structure.

10. The semiconductor device according to claim 8, wherein an interface between the doped semiconductor structure and the first conductive structure is narrower than the doped semiconductor structure.

11. The semiconductor device according to claim 8, wherein the first conductive structure is in contact with the first doped semiconductor portion and is spaced away from the second doped semiconductor portion.

12. The semiconductor device according to claim 8, wherein the first doped semiconductor portion has a doping concentration higher than a doping concentration of the second doped semiconductor portion.

13. The semiconductor device according to claim 8, wherein the first doped semiconductor portion is enclosed by the second doped semiconductor portion.

14. The semiconductor device according to claim 8, wherein top surfaces of the first and second doped semiconductor portions are coplanar with each other.

* * * * *